United States Patent
Sasaki et al.

(10) Patent No.: US 9,070,778 B2
(45) Date of Patent: Jun. 30, 2015

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Toshinari Sasaki, Shinagawa (JP); Shuhei Yokoyama, Tochigi (JP); Takashi Hamochi, Shimotsuga (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 181 days.

(21) Appl. No.: 13/713,186

(22) Filed: Dec. 13, 2012

(65) Prior Publication Data

US 2013/0153892 A1   Jun. 20, 2013

(30) Foreign Application Priority Data

Dec. 20, 2011 (JP) ................................ 2011-278889

(51) Int. Cl.
  *H01L 29/12*   (2006.01)
  *H01L 29/786*  (2006.01)
  *H01L 29/66*   (2006.01)

(52) U.S. Cl.
  CPC ...... *H01L 29/7869* (2013.01); *H01L 29/66969* (2013.01)

(58) Field of Classification Search
  USPC ............................................ 257/43; 438/104
  See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,888,858 A | 3/1999 | Yamazaki et al. |

(Continued)

FOREIGN PATENT DOCUMENTS

| | | |
|---|---|---|
| CN | 1169589 | 1/1998 |
| CN | 1941299 | 4/2007 |

(Continued)

OTHER PUBLICATIONS

International Search Report (Application No. PCT/JP2012/082857) Dated Apr. 9, 2013.

(Continued)

*Primary Examiner* — Long K Tran
(74) *Attorney, Agent, or Firm* — Eric J. Robinson; Robinson Intellectual Property Law Office, P.C.

(57) ABSTRACT

A highly reliable semiconductor device that includes a transistor including an oxide semiconductor is provided. In a semiconductor device which includes a bottom-gate transistor including an oxide semiconductor film, the spin density of the oxide semiconductor film is lower than or equal to $1 \times 10^{18}$ spins/cm$^3$, preferably lower than or equal to $1 \times 10^{17}$ spins/cm$^3$, further preferably lower than or equal to $1 \times 10^{16}$ spins/cm$^3$. The conductivity of the oxide semiconductor film is lower than or equal to $1 \times 10^3$ S/cm, preferably lower than or equal to $1 \times 10^2$ S/cm, further preferably lower than or equal to $1 \times 10^1$ S/cm.

11 Claims, 12 Drawing Sheets

(56) References Cited

U.S. PATENT DOCUMENTS

| | | | |
|---|---|---|---|
| 5,985,740 A | 11/1999 | Yamazaki et al. | |
| 6,063,654 A | 5/2000 | Ohtani | |
| 6,077,731 A | 6/2000 | Yamazaki et al. | |
| 6,093,934 A | 7/2000 | Yamazaki et al. | |
| 6,100,562 A | 8/2000 | Yamazaki et al. | |
| 6,180,439 B1 | 1/2001 | Yamazaki et al. | |
| 6,225,152 B1 | 5/2001 | Yamazaki et al. | |
| 6,294,274 B1 | 9/2001 | Kawazoe et al. | |
| 6,316,810 B1 | 11/2001 | Yamazaki et al. | |
| 6,465,287 B1 | 10/2002 | Yamazaki et al. | |
| 6,478,263 B1 | 11/2002 | Yamazaki et al. | |
| 6,504,174 B1 | 1/2003 | Yamazaki et al. | |
| 6,528,358 B1 | 3/2003 | Yamazaki et al. | |
| 6,528,820 B1 | 3/2003 | Yamazaki et al. | |
| 6,541,315 B2 | 4/2003 | Yamazaki et al. | |
| 6,563,174 B2 | 5/2003 | Kawasaki et al. | |
| 6,727,522 B1 | 4/2004 | Kawasaki et al. | |
| 6,744,069 B1 | 6/2004 | Yamazaki et al. | |
| 7,037,811 B1 | 5/2006 | Yamazaki et al. | |
| 7,049,190 B2 | 5/2006 | Takeda et al. | |
| 7,056,381 B1 | 6/2006 | Yamazaki et al. | |
| 7,061,014 B2 | 6/2006 | Hosono et al. | |
| 7,064,346 B2 | 6/2006 | Kawasaki et al. | |
| 7,078,727 B2 | 7/2006 | Yamazaki et al. | |
| 7,105,868 B2 | 9/2006 | Nause et al. | |
| 7,135,741 B1 | 11/2006 | Yamazaki et al. | |
| 7,141,491 B2 | 11/2006 | Yamazaki et al. | |
| 7,173,282 B2 | 2/2007 | Yamazaki et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,422,630 B2 | 9/2008 | Yamazaki et al. | |
| 7,427,780 B2 | 9/2008 | Yamazaki et al. | |
| 7,453,065 B2 | 11/2008 | Saito et al. | |
| 7,453,087 B2 | 11/2008 | Iwasaki | |
| 7,456,056 B2 | 11/2008 | Yamazaki et al. | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,679,087 B2 | 3/2010 | Yamazaki et al. | |
| 7,709,837 B2 | 5/2010 | Yamazaki et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0094625 A1* | 5/2003 | Yamazaki et al. | 257/151 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0304529 A1* | 12/2010 | Sasaki et al. | 438/104 |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0163311 A1 | 7/2011 | Akimoto et al. | |
| 2011/0227082 A1* | 9/2011 | Inoue et al. | 257/59 |
| 2012/0064664 A1 | 3/2012 | Yamazaki et al. | |
| 2012/0138922 A1 | 6/2012 | Yamazaki et al. | |
| 2012/0261657 A1 | 10/2012 | Takahashi et al. | |
| 2013/0099232 A1 | 4/2013 | Cho et al. | |
| 2013/0099237 A1 | 4/2013 | Sasaki et al. | |

FOREIGN PATENT DOCUMENTS

| | | |
|---|---|---|
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |

(56) References Cited

FOREIGN PATENT DOCUMENTS

| JP | 63-210024 A | 8/1988 |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-312260 A | 12/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| JP | 2011-181801 | 9/2011 |
| JP | 2011-181801 A | 9/2011 |
| WO | WO-2004/114391 | 12/2004 |

OTHER PUBLICATIONS

Written Opinion (Application No. PCT/JP2012/082857) Dated Apr. 9, 2013.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J at al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J at al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H at al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga-Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn]at Temperatures Over 1000° C.,", Journal of Solid State Chemistry, 1985, vol. 60, pp. 382-384.

Kitzerow.H at al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZn04,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

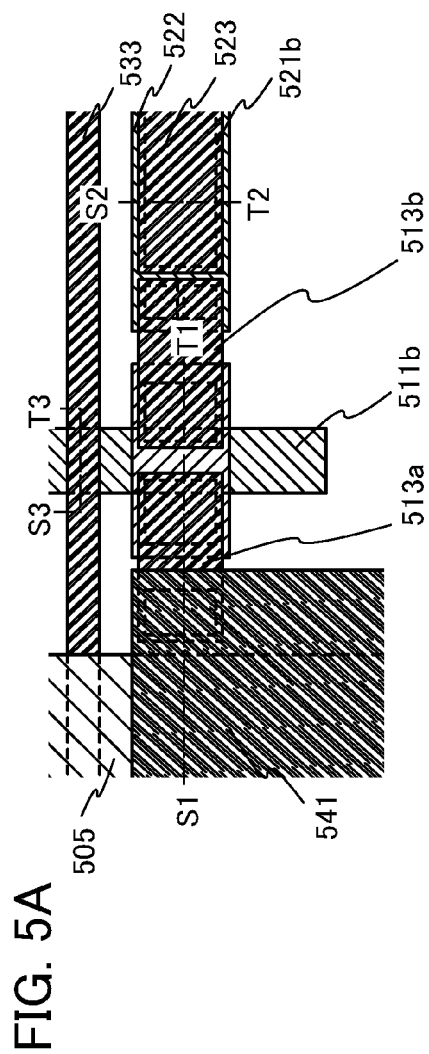

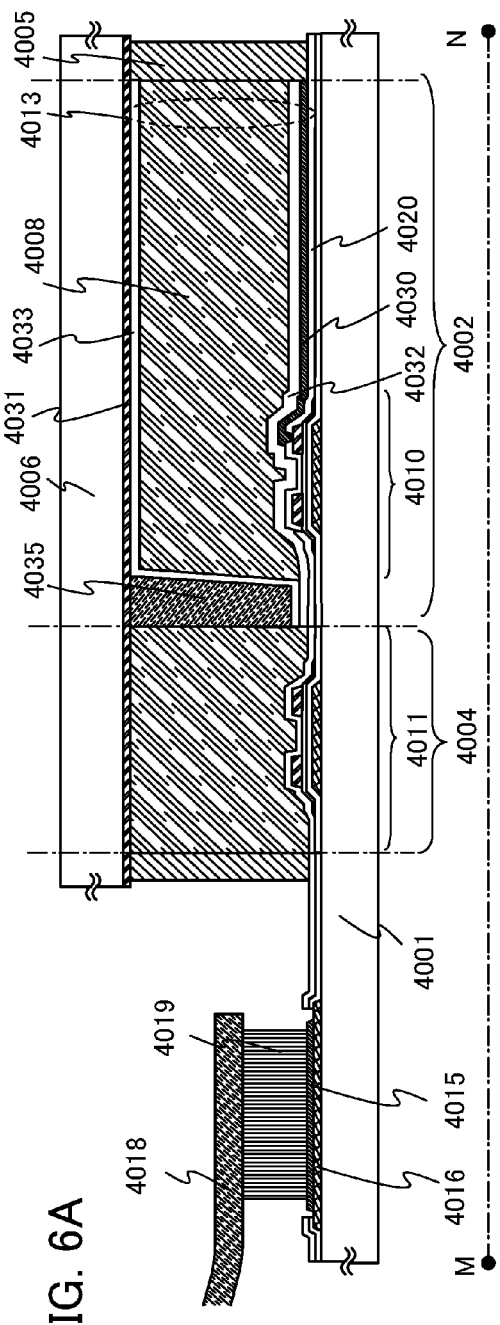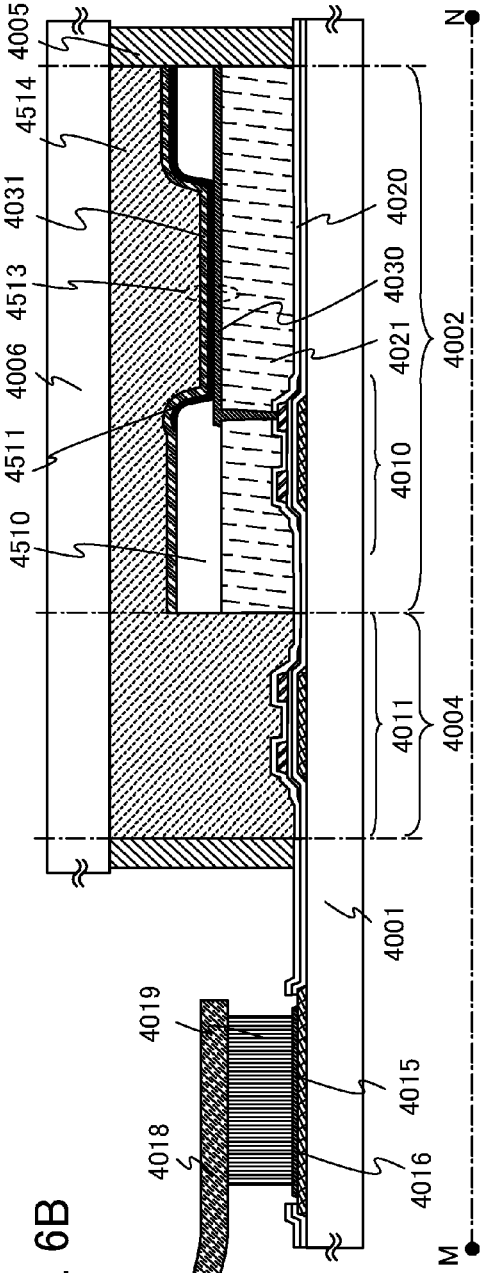

SEMICONDUCTOR DEVICE AND METHOD FOR MANUFACTURING SEMICONDUCTOR DEVICE

TECHNICAL FIELD

The present invention relates to a semiconductor device and a method for manufacturing the semiconductor device.

In this specification and the like, a semiconductor device refers to all types of devices which can function by utilizing semiconductor characteristics; an electro-optical device, a semiconductor circuit, and an electronic device are all semiconductor devices.

BACKGROUND ART

A technique by which a transistor is formed using a semiconductor thin film (also referred to as thin film transistor (TFT)) formed over a substrate having an insulating surface has been attracting attention. The transistor is applied to a wide range of electronic devices such as an integrated circuit (IC) and an image display device (display device). A silicon-based semiconductor material is widely known as a material for a semiconductor thin film applicable to the transistor. As another material, an oxide semiconductor has been attracting attention.

For example, a transistor whose semiconductor layer including an amorphous oxide containing indium (In), gallium (Ga), and zinc (Zn) (an In—Ga—Zn—O-based amorphous oxide) is formed over a substrate is disclosed (see Patent Document 1).

REFERENCE

[Patent Document 1] Japanese Published Patent Application No. 2011-181801

DISCLOSURE OF INVENTION

Improvement in reliability of semiconductor devices that include transistors including an oxide semiconductor is important for commercialization of the semiconductor devices.

In particular, variation and decrease in electrical characteristics of the semiconductor device might reduce the reliability thereof.

In view of the above problem, it is an object to provide a highly reliable semiconductor device that includes a transistor including an oxide semiconductor.

In a semiconductor device which includes a bottom-gate transistor including an oxide semiconductor film, the spin density of the oxide semiconductor film is lower than or equal to $1 \times 10^{18}$ spins/cm$^3$, preferably lower than or equal to $1 \times 10^{17}$ spins/cm$^3$, further preferably lower than or equal to $1 \times 10^{16}$ spins/cm$^3$. The conductivity of the oxide semiconductor film is lower than or equal to $1 \times 10^3$ S/cm, preferably lower than or equal to $1 \times 10^2$ S/cm, further preferably lower than or equal to $1 \times 10^1$ S/cm.

Defects typified by oxygen defects in the oxide semiconductor film are preferably reduced. Defects typified by oxygen defects function as sources for supplying carriers in the oxide semiconductor film, which might change the electric conductivity of the oxide semiconductor film. Therefore, the oxide semiconductor film in which such defects are reduced has stable electric conductivity and is more electrically stable with respect to irradiation with visible light, ultraviolet light, and the like.

The number of lone electrons in the oxide semiconductor film can be measured as a spin density of the oxide semiconductor film by electron spin resonance (ESR), whereby the number of oxygen defects can be estimated.

An oxide insulating film containing nitrogen can be used for an insulating film which is provided over a source electrode layer and a drain electrode layer and is in contact with the oxide semiconductor film.

The oxide insulating film containing nitrogen can be a silicon oxide film containing nitrogen, an aluminum oxide film containing nitrogen, or the like. The concentration of nitrogen in the oxide insulating film may be higher than or equal to 0.01 atoms %, preferably higher than or equal to 0.1 atoms % and lower than or equal to 50 atoms %, further preferably higher than or equal to 0.5 atoms % and lower than or equal to 15 atoms %. A silicon oxide film that contains nitrogen at the above concentration is referred to as a silicon oxynitride film in some cases. By containing an adequate amount of nitrogen, the oxygen insulating film can contain oxygen more than that in the stoichiometric composition.

The silicon oxynitride film can be formed by a formation method using a film formation gas, for example, by a chemical vapor deposition (CVD) method.

One embodiment of the invention disclosed in this specification is a semiconductor device which includes a gate electrode layer over a substrate having an insulating surface; a gate insulating film, an oxide semiconductor film, and source and drain electrode layers which are stacked in this order over the gate electrode layer; and an oxide insulating film which is over the source and drain electrode layers and in contact with the oxide semiconductor film and contains nitrogen. The spin density of the oxide semiconductor film is lower than or equal to $1 \times 10^{18}$ spins/cm$^3$.

Another embodiment of the invention disclosed in this specification is a method for manufacturing a semiconductor device including the following steps: forming a gate electrode layer; forming a gate insulating film over the gate electrode layer; forming an oxide semiconductor film over the gate insulating film in a region overlapping with the gate electrode layer; forming source and drain electrode layers electrically connected to the oxide semiconductor film; and forming an oxide insulating film containing nitrogen over the oxide semiconductor film and the source and drain electrode layers to be in contact with the oxide semiconductor film. The spin density of the oxide semiconductor film is lower than or equal to $1 \times 10^{18}$ spins/cm$^3$.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed using an oxide semiconductor or a semiconductor device including a circuit which is formed by using such a transistor. For example, the present invention relates to an electronic device which includes, as a component, an LSI, a CPU, a power device mounted in a power circuit, a semiconductor integrated circuit including a memory, a thyristor, a converter, an image sensor, or the like, an electro-optical device typified by a liquid crystal display panel, or a light-emitting display device including a light-emitting element.

A highly reliable semiconductor device which includes a transistor including an oxide semiconductor is provided.

BRIEF DESCRIPTION OF DRAWINGS

FIGS. 5A and 5B are a plan view and a cross-sectional view illustrating one embodiment of a semiconductor device.

FIGS. 6A and 6B are cross-sectional views each illustrating one embodiment of a semiconductor device.

BEST MODE FOR CARRYING OUT THE INVENTION

Embodiments of the present invention are described below in detail with reference to the accompanying drawings. However, the invention disclosed in this specification is not limited to the following description, and it is easily understood by those skilled in the art that modes and details thereof can be variously changed. Therefore, the invention disclosed in this specification is not construed as being limited to the following description. Note that the ordinal numbers such as "first" and "second" in this specification are used for convenience and do not denote the order of steps and the stacking order of layers. In addition, the ordinal numbers in this specification do not denote particular names which specify the invention.

[Embodiment 1]

In this embodiment, one embodiment of a semiconductor device and a method for manufacturing the semiconductor device are described with reference to FIGS. 1A and 1B. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
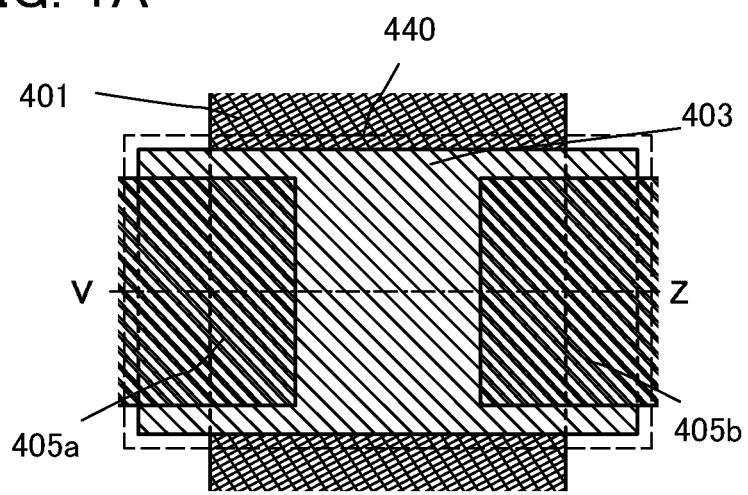
FIGS. 1A and 1B are a plan view and a cross-sectional view illustrating one embodiment of a semiconductor device.
Figure 1B:
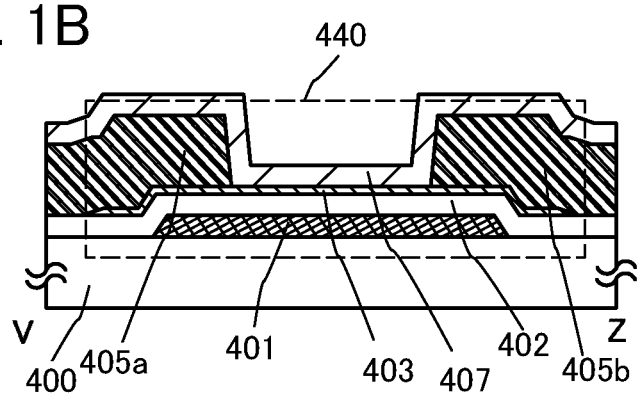

A transistor 440 illustrated in FIGS. 1A and 1B is an example of a transistor which is a kind of bottom-gate transistor and is also referred to as an inverted-staggered transistor. FIG. 1A is a plan view, and FIG. 1B is a cross-sectional view taken along the chain line V-Z in FIG. 1A.

As illustrated in FIG. 1B, which is the cross-sectional view of the transistor 440 in a channel length direction, a semiconductor device including the transistor 440 includes a gate electrode layer 401 over a substrate 400 and a gate insulating film 402, an oxide semiconductor film 403, a source electrode layer 405a, and a drain electrode layer 405b which are over the gate electrode layer 401. Further, an insulating film 407 covering the transistor 440 is provided.

The transistor 440 disclosed in this specification includes the oxide semiconductor film 403 having a spin density of $1\times10^{18}$ spins/cm$^3$ or lower, preferably $1\times10^{17}$ spins/cm$^3$ or lower, further preferably $1\times10^{16}$ spins/cm$^3$ or lower. The conductivity of the oxide semiconductor film 403 is lower than or equal to $1\times10^{3}$ S/cm, preferably lower than or equal to $1\times10^{2}$ S/cm, further preferably lower than or equal to $1\times10^{1}$ S/cm.

The oxide semiconductor film 403 in this embodiment has a low spin density, few defects, and a low conductivity. With the oxide semiconductor film 403, the normally-off transistor 440 having favorable electrical characteristics can be provided.

An oxide semiconductor used for the oxide semiconductor film 403 contains at least indium (In). In particular, In and zinc (Zn) are preferably contained. It is preferable that gallium (Ga) be additionally contained as a stabilizer for reducing variation in electrical characteristics of a transistor including the oxide semiconductor film. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga—based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn—based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by a chemical formula InMO$_3$(ZnO)$_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula In$_2$SnO$_5$(ZnO)$_n$ (n>0, n is an integer) may be used.

For example, an In—Ga—Zn-based oxide with an atomic ratio of In:Ga:Zn being 1:1:1 (=1/3:1/3:1/3), 2:2:1 (=2/5:2/5:1/5), or 3:1:2 (=1/2:1/6:1/3), or any of oxides whose composition is in the neighborhood of the above compositions can be used. Alternatively, an In—Sn—Zn-based oxide with an atomic ratio of In:Sn:Zn is 1:1:1 (=1/3:1/3:1/3), 2:1:3 (=1/3:1/6:1/2), or 2:1:5 (=1/4:1/8:5/8), or any of oxides whose composition is in the neighborhood of the above compositions can be used.

However, the composition of the oxide semiconductor containing indium is not limited to those described above, and a material having an appropriate composition can be used in accordance with semiconductor characteristics which are necessary (such as mobility, threshold value, and variation). In order to obtain semiconductor characteristics which are necessary, it is preferable that the carrier density, the impurity concentration, the defect density, the atomic ratio of a metal element to oxygen, the interatomic distance, the density, and the like be set as appropriate.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

Note that the oxide semiconductor film 403 is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is a thin film which is single crystal along c-axis. The film has a mosaic pattern in the a-b plane, and the crystal grain boundary is unclear. The CAAC-OS film is not completely single crystal nor completely amorphous. The CAAC-OS film is an oxide semiconductor film with a crystal-amorphous mixed phase structure where a crystal portion is included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal region may be different from those of another crystal region. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystallization is caused from a surface side of the oxide semiconductor film, the proportion of crystal portions in the vicinity of the surface of the oxide semiconductor film is higher than that in the vicinity of the surface where the oxide semiconductor film is formed in some cases. Further, when impurities are added to the CAAC-OS film, the crystal portion in a region to which the impurities are added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing a treatment for crystallization such as a heat treatment after film formation.

With use of the CAAC-OS film in a transistor, variation in electrical characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor is preferably formed over a surface with an average surface roughness (Ra) of less than or equal to 1 nm, further preferably less than or equal to 0.3 nm, still further preferably less than or equal to 0.1 nm.

Note that an average surface roughness (Ra) is obtained by expanding arithmetic mean surface roughness, which is defined by JIS B0601: 2001 (ISO4287: 1997), into three dimensions so as to be applicable to a curved surface. Moreover, an average surface roughness (Ra) can be expressed as "the average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the designated surface on the xy plane is represented by $S_0$, and the height of the reference surface (the average height of the designated surface) is represented by $Z_0$. The average surface roughness Ra can be measured using an atomic force microscope (AFM).

Note that since the transistor 440 is a bottom-gate transistor, the substrate 400, the gate electrode layer 401, and the gate insulating film 402 are located below the oxide semiconductor film. Accordingly, planarization treatment such as CMP treatment may be performed after the gate electrode layer 401 and the gate insulating film 402 are formed to obtain the above flat surface.

The oxide semiconductor film 403 has a thickness larger than or equal to 1 nm and smaller than or equal to 30 nm (preferably larger than or equal to 5 nm and smaller than or equal to 10 nm) and can be formed by a sputtering method, a molecular beam epitaxy (MBE) method, a CVD method, a pulse laser deposition method, an atomic layer deposition (ALD) method, or the like as appropriate. Alternatively, the oxide semiconductor film 403 may be formed with a sputtering apparatus where deposition is performed with surfaces of a plurality of substrates set substantially perpendicular to a surface of a sputtering target.

For example, the CAAC-OS film is formed by a sputtering method with a polycrystalline oxide semiconductor sputtering target. When ions collide with the sputtering target, a crystal region included in the sputtering target may be cleaved along an a-b plane, and a sputtered particle having a plane parallel to an a-b plane (flat-plate-like sputtered particle or pellet-like sputtered particle) may separate from the sputtering target. In that case, the flat-plate-like sputtered particle reaches a substrate while maintaining their crystal state, whereby the CAAC-OS film can be formed.

For the deposition of the CAAC-OS film, the following conditions are preferably employed.

By reducing the number of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is lower than or equal to $-80°$ C., preferably lower than or equal to $-100°$ C. is used.

By increasing the substrate heating temperature during the deposition, migration of a sputtered particle is likely to occur after the sputtered particle reaches a substrate surface. Specifically, the substrate heating temperature during the deposition is higher than or equal to $100°$ C. and lower than or equal to $740°$ C., preferably higher than or equal to $200°$ C. and lower than or equal to $500°$ C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Further, it is preferable that the proportion of oxygen in the deposition gas be increased and the power be optimized in order to reduce plasma damage at the deposition. The proportion of oxygen in the deposition gas is higher than or equal to 30 vol. %, preferably 100 vol. %.

As an example of the sputtering target, an In—Ga—Zn—O compound target is described below.

The In—Ga—Zn—O compound target, which is polycrystalline, is made by mixing $InO_x$ powder, $GaO_y$ powder, and $ZnO_z$ powder in a predetermined molar ratio, applying pressure, and performing a heat treatment at a temperature higher than or equal to $1000°$ C. and lower than or equal to $1500°$ C. Note that x, y, and z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

It is preferable that the oxide semiconductor film 403 be the one which is highly purified and hardly contain impurities such as copper, aluminum, and chlorine. In the process for manufacturing the transistor, steps in which these impurities are not mixed into the oxide semiconductor film or attached to the surface of the oxide semiconductor film are preferably selected as appropriate. In the case where the impurities are attached to the surface of the oxide semiconductor film, the impurities on the surface of the oxide semiconductor film are preferably removed by exposure to oxalic acid or dilute hydrofluoric acid or plasma treatment (such as $N_2O$ plasma treatment). Specifically, the concentration of copper in the oxide semiconductor film is lower than or equal to $1 \times 10^{18}$ atoms/cm$^3$, preferably lower than or equal to $1 \times 10^{17}$ atoms/cm$^3$. The concentration of aluminum in the oxide semiconductor film is lower than or equal to $1 \times 10^{18}$ atoms/cm$^3$. The concentration of chlorine in the oxide semiconductor film is lower than or equal to $2 \times 10^{18}$ atoms/cm$^3$.

Figure 2A:
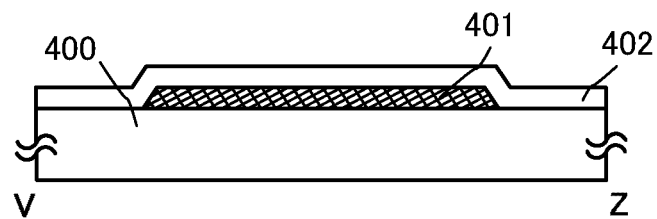
FIGS. 2A to 2C are cross-sectional views illustrating one embodiment of a method for manufacturing a semiconductor device.
Figure 2B:
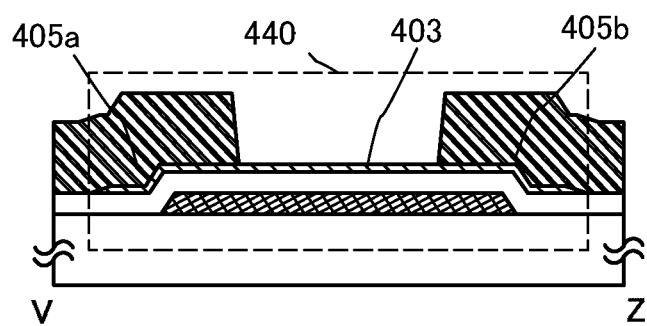
Figure 2C:
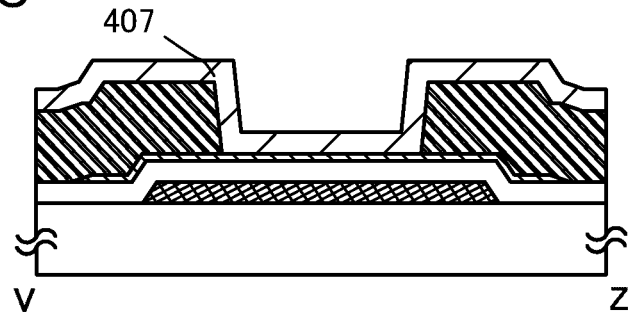

FIGS. 2A to 2C illustrate an example of a method for manufacturing a semiconductor device including the transistor 440.

There is no particular limitation on a substrate that can be used as the substrate 400 having an insulating surface as long as it has heat resistance enough to withstand a heat treatment performed later. A variety of glass substrates for electronics industry, such as a barium borosilicate glass substrate and an aluminoborosilicate glass substrate, can be used as the substrate 400. Note that as the substrate, a substrate having a thermal expansion coefficient greater than or equal to $25 \times 10^{-7}/°$ C. and less than or equal to $50 \times 10^{-7}/°$ C. (preferably greater than or equal to $30 \times 10^{-7}/°$ C. and less than or equal to $40 \times 10^{-7}/°$ C.) and a strain point higher than or equal to $650°$ C. and lower than or equal to $750°$ C. (preferably higher than or equal to $700°$ C. and lower than or equal to $740°$ C.) is preferably used.

In the case where a large-sized substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, when such a large-sized glass substrate is used as the substrate, the one with a small shrinkage is preferably used. For example, a large-sized glass substrate which has a shrinkage of 20 ppm or less, preferably 10 ppm or less, further preferably 5 ppm or less after heat treatment at $450°$ C., preferably $500°$ C. for one hour may be used as the substrate.

For example, a ceramic substrate, a quartz substrate, a sapphire substrate, or the like can be used as the substrate 400. Alternatively, a single crystal semiconductor substrate or a polycrystalline semiconductor substrate made of silicon or silicon carbide, a compound semiconductor substrate made of silicon germanium or the like, an SOI substrate, or the like can be used. Alternatively, any of these substrates over which a semiconductor element is provided may be used.

The semiconductor device may be manufactured using a flexible substrate as the substrate 400. To manufacture a flexible semiconductor device, the transistor 440 including the oxide semiconductor film 403 may be directly formed over a flexible substrate; or alternatively, the transistor 440 including the oxide semiconductor film 403 may be formed over a formation substrate, and then may be separated from the formation substrate and transferred to a flexible substrate. Note that, in order to separate the transistor from the formation substrate and transfer it to the flexible substrate, a separation layer may be provided between the formation substrate and the transistor 440 including an oxide semiconductor film.

As a base film, an insulating film may be provided over the substrate 400. The insulating film can be formed by a plasma CVD method, a sputtering method, or the like, using an oxide insulating material such as silicon oxide, silicon oxynitride, aluminum oxide, aluminum oxynitride, hafnium oxide, or gallium oxide; a nitride insulating material such as silicon nitride, silicon nitride oxide, aluminum nitride, or aluminum nitride oxide; or a mixed material of any of these materials.

The substrate 400 (or the substrate 400 and the base film) may be subjected to a heat treatment. For example, the heat treatment can be performed at 650° C. for 1 minute to 5 minutes with a gas rapid thermal annealing (GRTA) apparatus which performs a heat treatment using a high-temperature gas. As the high-temperature gas in the GRTA apparatus, an inert gas which does not react with an object to be processed by a heat treatment, such as nitrogen or a rare gas like argon, is used. Alternatively, the heat treatment may be performed at 500° C. for 30 minutes to an hour with an electric furnace.

Next, a conductive film is formed over the substrate 400 and is etched into the gate electrode layer 401. Note that the conductive film may be etched using either dry etching or wet etching, or using both dry etching and wet etching.

The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a layered structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a layered structure of the above conductive material and the above metal material.

As the gate electrode layer 401, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV (electron volts), preferably higher than or equal to 5.5 eV (electron volts), and the use of this film as the gate electrode layer enables the threshold voltage of electrical characteristics of a transistor to be positive. Accordingly, a normally-off switching element can be obtained.

In this embodiment, a tungsten film with a thickness of 100 nm is formed by a sputtering method.

The substrate 400 and the gate electrode layer 401 may be subjected to a heat treatment after the gate electrode layer 401 is formed. For example, the heat treatment can be performed at 650° C. for 1 minute to 5 minutes with a GRTA apparatus. Alternatively, the heat treatment may be performed at 500° C. for 30 minutes to an hour with an electric furnace.

Next, the gate insulating film 402 is formed over the gate electrode layer 401 (see FIG. 2A).

To improve the coverage with the gate insulating film 402, planarization treatment may be performed on a surface of the gate electrode layer 401. It is preferable that the flatness of the surface of the gate electrode layer 401 be good particularly when the thickness of the gate insulating film 402 is small.

The thickness of the gate insulating film 402 is greater than or equal to 1 nm and less than or equal to 300 nm and the gate insulating film 402 can be formed by a sputtering method or a CVD method using a film formation gas. As the CVD method, a low pressure CVD (LPCVD) method, a plasma CVD method, or the like can be used. Alternatively, a coating method can be used, for example.

The gate insulating film 402 can be formed using a silicon oxide film, a gallium oxide film, an aluminum oxide film, a silicon nitride film, a silicon oxynitride film, an aluminum oxynitride film, or a silicon nitride oxide film.

The gate insulating film 402 can be formed using a high-k material such as a hafnium oxide film, an yttrium oxide film, a hafnium silicate film ($HfSi_xO_y$ (x>0, y>0)), a hafnium silicate film to which nitrogen is added ($HfSiO_xN_y$ (x>0, y>0)), a hafnium aluminate film ($HfAl_xO_y$ (x>0, y>0)), or a lanthanum oxide film, whereby gate leakage current can be reduced. Further, the gate insulating film 402 may have either a single-layer structure or a layered structure.

In this embodiment, a silicon oxynitride film with a thickness of 100 nm is formed as the gate insulating film 402 by a plasma CVD method.

The gate insulating film 402 may be subjected to dehydration or dehydrogenation treatment by heat treatment. Even if a gas containing hydrogen is used as a film formation gas for the gate insulating film 402, hydrogen in the gate insulating film 402 can be removed by dehydrogenation treatment performed on the gate insulating film 402. Thus, a plasma CVD method can be preferably employed. By a plasma CVD method, a film can be deposited at relatively high deposition rate with less dust or the like attached to or mixed into the film in film deposition; accordingly, the film thickness can be increased, leading to advantages in productivity.

The temperature of the heat treatment is higher than or equal to 300° C. and lower than or equal to 700° C., or lower than the strain point of the substrate. The temperature of the heat treatment is preferably higher than the film formation temperature of the gate insulating film 402 because the film is more effectively dehydrated or dehydrogenated. For example, the substrate is put in an electric furnace which is a kind of heat treatment apparatus, and then the gate insulating film 402 is subjected to heat treatment at 450° C. for one hour under vacuum.

Note that the heat treatment apparatus is not limited to the electric furnace, and an apparatus for heating an object to be processed by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

The heat treatment may be performed under reduced pressure (under vacuum), under a nitrogen atmosphere, or under a rare gas atmosphere. It is preferable that water, hydrogen, and the like be not contained in the atmosphere of nitrogen, a rare gas, or the like. The purity of nitrogen or the rare gas which is introduced into the heat treatment apparatus is preferably 6N or higher (99.9999%), further preferably 7N or higher (99.99999%) (that is, the impurity concentration is preferably lower than or equal to 1 ppm, further preferably lower than or equal to 0.1 ppm).

By the heat treatment, the gate insulating film 402 can be dehydrated or dehydrogenated, whereby the gate insulating film 402 from which impurities such as hydrogen and water causing a change in characteristics of a transistor is eliminated can be formed.

In the heat treatment where dehydration or dehydrogenation treatment is performed, it is preferable that a surface of the gate insulating film 402 be not in a state where hydrogen, water, or the like is prevented from being released (for example, by providing a film or the like which is not permeable to (or blocks) hydrogen, water, or the like), but in a state where the surface of the gate insulating film 402 is exposed.

The heat treatment for dehydration or dehydrogenation may be performed plural times, and may double as another heat treatment.

Oxygen doping treatment may be performed on the gate insulating film 402 which has been dehydrated or dehydrogenated. By the oxygen doping treatment on the gate insulating film 402, oxygen is supplied to the gate insulating film 402, so that oxygen is contained in the gate insulating film 402 and the vicinity of the interface.

The gate insulating film 402 preferably contains oxygen which exceeds at least the stoichiometric ratio in (a bulk of) the film.

Note that "oxygen doping" in this specification means that oxygen (which includes at least one of an oxygen radical, an oxygen atom, an oxygen molecule, ozone, an oxygen ion (oxygen molecule ion), and oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

In this specification, oxygen (an oxygen radical, an oxygen atom, an oxygen molecule, ozone, an oxygen ion (oxygen molecule ion), and/or oxygen cluster ion) is doped by an ion implantation method, an ion doping method, a plasma immersion ion implantation method, plasma treatment, or the like. Further, a gas cluster ion beam can be used for the ion implantation method. The oxygen doping treatment may be performed on the entire surface at one time or may be performed by scanning the substrate by a linear ion beam or the like.

For example, oxygen for the doping (an oxygen radical, an oxygen atom, an oxygen molecule, ozone, an oxygen ion (oxygen molecule ion), and/or oxygen cluster ion) may be supplied from a plasma generating apparatus with use of a gas containing oxygen or from an ozone generating apparatus. Specifically, for example, oxygen can be generated with an apparatus for etching treatment on a semiconductor device, an apparatus for ashing on a resist mask, or the like to process the gate insulating film 402.

A gas containing oxygen can be used for the oxygen doping treatment. As the gas containing oxygen, dinitrogen monoxide, nitrogen dioxide, carbon dioxide, carbon monoxide, or the like can be used. Alternatively, a rare gas may be used for the oxygen doping treatment.

For example, in the case where an oxygen ion is implanted by an ion implantation method for oxygen doping, the dose may be greater than or equal to $1 \times 10^{13}$ ions/cm$^2$ and smaller than or equal to $5 \times 10^{16}$ ions/cm$^2$.

Further, the planarity of the surface of the gate insulating film 402 can be improved by the oxygen doping treatment.

Next, the oxide semiconductor film 403 is formed over the gate insulating film 402.

A planarization treatment may be performed on the region of the gate insulating film 402 which is in contact with the oxide semiconductor film 403. As the planarization treatment, a polishing treatment (e.g., a chemical mechanical polishing (CMP) method), a dry etching treatment, or a plasma treatment can be used, though there is no particular limitation on the planarization treatment. Note that the above-described oxygen doping treatment can also serve as the planarization treatment of the gate insulating film 402.

As a plasma treatment, reverse sputtering in which an argon gas is introduced and plasma is generated can be performed. The reverse sputtering is a method in which voltage is applied to a substrate side with the use of an RF power source under an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating film 402.

As the planarization treatment, a polishing treatment, a dry etching treatment, or a plasma treatment may be performed plural times, or these treatments may be performed in combination. In the case where the treatments are combined, the order of steps is not particularly limited and may be set as appropriate depending on the roughness of the surface of the gate insulating film 402.

Note that it is preferable that the oxide semiconductor film 403 be formed under a condition that much oxygen is contained during film formation (e.g., deposited by a sputtering method under a 100% oxygen atmosphere), so that a film containing much oxygen (preferably including a region containing oxygen in excess of the stoichiometric composition of an oxide semiconductor in a crystalline state) is formed.

Note that in this embodiment, as the oxide semiconductor film 403, an In—Ga—Zn-based oxide film (IGZO film) with a thickness of 35 nm is formed by a sputtering method with a sputtering apparatus including an AC power supply device. In this embodiment, an In—Ga—Zn-based oxide target with an atomic ratio of In:Ga:Zn being 1:1:1 (=1/3:1/3:1/3) is used. Note that deposition conditions are as follows: atmosphere, oxygen gas and argon gas (the flow rate of oxygen: 50%); pressure, 0.6 Pa; electric power, 5 kW; and substrate temperature, 170° C. Here, the deposition rate is 16 nm/min.

It is preferable that a high-purity gas from which impurities such as hydrogen, water, a hydroxyl group, and hydride is removed be used as a sputtering gas when the oxide semiconductor film 403 is deposited.

The substrate is held in a deposition chamber kept under reduced pressure. Then, a sputtering gas from which hydrogen and moisture are removed is introduced while residual moisture in the deposition chamber is removed, and the oxide semiconductor film 403 is deposited over the substrate 400 using the above target. In order to remove the residual moisture in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, for example, hydrogen (a hydrogen atom), a compound containing hydrogen (a hydrogen atom), such as water ($H_2O$), (further preferably, also a compound containing a carbon atom), and the like are evacuated, whereby the concentration of impurities contained in the oxide semiconductor film 403 deposited in the deposition chamber can be reduced.

It is preferable to form the gate insulating film 402 and the oxide semiconductor film 403 in succession so as not to expose the gate insulating film 402 to the air. Forming the gate insulating film 402 and the oxide semiconductor film 403 in succession so as not to expose the gate insulating film 402 to the air can prevent impurities such as hydrogen and moisture from being adsorbed onto the surface of the gate insulating film 402.

Further, heat treatment may be performed on the oxide semiconductor film 403 in order to remove excess hydrogen (including water and a hydroxyl group) (to perform dehydration or dehydrogenation treatment).

In this embodiment, the substrate is introduced into an electric furnace which is one of heat treatment apparatuses, and the oxide semiconductor film 403 is subjected to heat treatment at 450° C. under a nitrogen atmosphere for one hour and further to heat treatment at 450° C. under an atmosphere of nitrogen and oxygen for one hour.

Note that the heat treatment apparatus is not limited to the electric furnace, and an apparatus for heating an object to be processed by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably 6N or higher (99.9999%), further preferably 7N or higher (99.99999%) (that is, the impurity concentration is preferably lower than or equal to 1 ppm, further preferably lower than or equal to 0.1 ppm).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably lower than or equal to 1 ppm, further preferably lower than or equal to 0.1 ppm). The oxygen gas or the dinitrogen monoxide gas acts to supply oxygen that is a main constituent material of the oxide semiconductor and that is reduced by the step for removing impurities for dehydration or dehydrogenation, so that the oxide semiconductor film 403 can be a highly-purified, i-type (intrinsic) oxide semiconductor film.

The timing of the heat treatment for dehydration or dehydrogenation may be either after the formation of the oxide semiconductor film or after the formation of the island-shaped oxide semiconductor film 403.

The heat treatment for dehydration or dehydrogenation may be performed plural times and may double as another heat treatment.

It is preferable that the heat treatment for dehydration or dehydrogenation be performed while the gate insulating film 402 is covered with the oxide semiconductor film which has not been processed into the island-shaped oxide semiconductor film 403 because oxygen contained in the gate insulating film 402 can be prevented from being released by the heat treatment.

The oxide semiconductor film 403 can be highly purified with the dehydration or dehydrogenation treatment.

It is preferable that the concentration of hydrogen in the oxide semiconductor film 403 is lower than or equal to $2\times10^{19}/cm^3$, preferably lower than or equal to $5\times10^{18}/cm^3$, further preferably lower than or equal to $2\times10^{18}/cm^3$.

Note that the concentration of hydrogen can be measured by analysis using secondary ion mass spectrometry (SIMS).

Further, oxygen (which includes at least one of an oxygen radical, an oxygen atom, and an oxygen ion) may be introduced to the oxide semiconductor film 403 which has been subjected to the dehydration or dehydrogenation treatment to supply oxygen to the oxide semiconductor film.

The dehydration or dehydrogenation treatment may be accompanied by elimination of oxygen which is a main constituent material of an oxide semiconductor to lead to a reduction in oxygen. Oxygen vacancies exist in a portion where oxygen is eliminated in an oxide semiconductor film, and a donor level which leads to variation in electrical characteristics of a transistor is formed owing to the oxygen vacancies.

Thus, oxygen (an oxygen radical, an oxygen atom, an oxygen molecule, ozone, an oxygen ion (oxygen molecule ion), and/or oxygen cluster ion) is preferably supplied to the oxide semiconductor film which has been subjected to the dehydration or dehydrogenation treatment. By supply of oxygen to the oxide semiconductor film, oxygen vacancies in the film can be repaired.

Oxygen is introduced to the dehydrated or dehydrogenated oxide semiconductor film 403 to be supplied thereto, so that the oxide semiconductor film 403 can be highly purified and be i-type (intrinsic). Variation in electrical characteristics of a transistor having the highly-purified and i-type (intrinsic) oxide semiconductor film 403 is suppressed, and thus the transistor is electrically stable.

Oxygen can be introduced by an ion implantation method, an ion doping method, a plasma immersion ion implantation method, plasma treatment, or the like. Further, a gas cluster ion beam can be used for the ion implantation method. The doping treatment may be performed on the entire surface at one time or may be performed by scanning the substrate by a linear ion beam or the like.

For example, oxygen for the doping (an oxygen radical, an oxygen atom, an oxygen molecule, ozone, an oxygen ion (oxygen molecule ion), and/or oxygen cluster ion) may be supplied from a plasma generating apparatus with use of a gas containing oxygen or from an ozone generating apparatus. Specifically, for example, oxygen can be generated with an apparatus for etching treatment on a semiconductor device, an apparatus for ashing on a resist mask, or the like to process the oxide semiconductor film.

In the step of introduction of oxygen to the oxide semiconductor film 403, oxygen may be added to the oxide semiconductor film 403 directly or to the oxide semiconductor film 403 through another film such as the insulating film 407. An ion implantation method, an ion doping method, a plasma immersion ion implantation method, or the like can be employed for the introduction of oxygen through another film, whereas plasma treatment or the like can also be employed for the direct introduction of oxygen to the exposed oxide semiconductor film 403.

The introduction of oxygen to the oxide semiconductor film 403 is preferably performed after dehydration or dehydrogenation treatment is performed thereon, but the timing is not limited thereto. Further, oxygen may be introduced plural times into the dehydrated or dehydrogenated oxide semiconductor film 403.

It is preferable that the oxide semiconductor film provided in the transistor include a region containing oxygen in excess of the stoichiometric composition of an oxide semiconductor in a crystalline state. In this case, the oxygen content is preferably larger than that in the stoichiometric composition of the oxide semiconductor. Alternatively, the oxygen content is higher than that of the oxide semiconductor in a single crystal state. In some cases, oxygen may exist between lattices of the oxide semiconductor.

Further, a resist mask for forming the island-shaped oxide semiconductor film 403 may be formed by an ink-jet method. Formation of the resist mask by an ink-jet method needs no photomask; thus, manufacturing cost can be reduced.

Note that the etching of the oxide semiconductor film 403 may be performed using either dry etching or wet etching, or using both dry etching and wet etching. As an etchant used for wet etching of the oxide semiconductor film 403, for example, a mixed solution of phosphoric acid, acetic acid, and nitric acid, or the like can be used. In addition, ITO-07N (produced by KANTO CHEMICAL CO., INC.) may also be used. Further alternatively, the oxide semiconductor film 403 may be etched by a dry etching method using an inductively coupled plasma (ICP) etching method.

Next, a conductive film to be the source electrode layer and the drain electrode layer (including a wiring formed in the same layer as the source electrode layer and the drain electrode layer) is formed over the gate electrode layer 401, the gate insulating film 402, and the oxide semiconductor film 403.

The conductive film is formed using a material that can withstand a heat treatment in a later step. As the conductive film used for the source electrode layer and the drain electrode layer, it is possible to use, for example, a metal film containing an element selected from Al, Cr, Cu, Ta, Ti, Mo, and W, a metal nitride film containing any of these elements as its component (e.g., a titanium nitride film, a molybdenum nitride film, or a tungsten nitride film), or the like. A metal film having a high melting point such as Ti, Mo, W, or the like or a metal nitride film of any of these elements (e.g., a titanium nitride film, a molybdenum nitride film, or a tungsten nitride film) may be stacked on one of or both of a lower side and an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

Through a photolithography process, a resist mask is formed over the conductive film, and the source electrode layer 405a and the drain electrode layer 405b are formed by selective etching. After the source electrode layer 405a and the drain electrode layer 405b are formed, the resist mask is removed.

Ultraviolet, KrF laser light, ArF laser light, or the like can be used for light exposure at the time of forming a resist mask. The channel length L of the transistor 440 that is to be completed later is determined by a distance between bottom edges of the source electrode layer 405a and the drain electrode layer 405b which are adjacent to each other over the oxide semiconductor film 403. In the case where the channel length L is less than 25 nm, the light exposure at the time of forming the resist mask can be performed using extreme ultraviolet having an extremely short wavelength of several nanometers to several tens of nanometers. In the light exposure by extreme ultraviolet light, the resolution is high and the focus depth is large. Therefore, the channel length L of the transistor that is to be completed later can be greater than or equal to 10 nm and less than or equal to 1000 nm, which enables high operation speed of a circuit.

In order to reduce the number of photomasks used in the photolithography process and reduce the number of photolithography processes, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography processes can also be reduced, whereby the process can be simplified.

In this embodiment, the conductive film can be etched using a gas containing chlorine, for example, a gas containing chlorine ($Cl_2$), boron trichloride ($BCl_3$), silicon tetrachloride ($SiCl_4$), or carbon tetrachloride ($CCl_4$). Alternatively, a gas containing fluorine, for example, a gas containing carbon tetrafluoride ($CF_4$), sulfur hexafluoride ($SF_6$), nitrogen trifluoride ($NF_3$), or trifluoromethane ($CHF_3$) can be used. Alternatively, any of these gases to which a rare gas such as helium (He) or argon (Ar) is added, or the like can be used.

As the etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, as the conductive film, a stack of a 100-nm-thick titanium film, a 400-nm-thick aluminum film, and a 100-nm-thick titanium film which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: the flow rate of $BCl_3$ is 750 sccm and the flow rate of $Cl_2$ is 150 sccm; the bias power is 1500 W; the ICP power is 0 W; and the pressure is 2.0 Pa. The second etching conditions are as follows: the flow rate of $BCl_3$ is 700 sccm and the flow rate of $Cl_2$ is 100 sccm; the bias power is 750 W; the ICP power is 0 W; and the pressure is 2.0 Pa.

Note that it is preferable that etching conditions be optimized so as not to etch and divide the oxide semiconductor film 403 when the conductive film is etched. However, it is difficult to obtain etching conditions in which only the conductive film is etched and the oxide semiconductor film 403 is not etched at all. In some cases, part of the oxide semiconductor film 403 is etched off through the etching of the conductive film, so that an oxide semiconductor film having a groove (depressed portion) is formed.

Through the above-described process, the transistor 440 of this embodiment is formed (see FIG. 2B).

In this embodiment, the insulating film 407 is formed over the source electrode layer 405a and the drain electrode layer 405b and in contact with the oxide semiconductor film 403 (see FIG. 2C).

The insulating film 407 can be formed by a CVD method using a film formation gas. As the CVD method, an LPCVD method, a plasma CVD method, or the like can be used. Alternatively, a coating method can be used, for example.

The insulating film 407 can be formed using an oxide insulating film containing nitrogen.

The oxide insulating film containing nitrogen can be a silicon oxide film containing nitrogen, an aluminum oxide film containing nitrogen, or the like. The concentration of nitrogen in the oxide insulating film may be higher than or equal to 0.01 atoms %, preferably higher than or equal to 0.1 atoms % and lower than or equal to 50 atoms %, further preferably higher than or equal to 0.5 atoms % and lower than or equal to 15 atoms %. A silicon oxide film that contains nitrogen at the above concentration is referred to as a silicon oxynitride film in some cases. By containing an adequate amount of nitrogen, the oxygen insulating film can contain oxygen more than that in the stoichiometric composition.

In this embodiment, a silicon oxynitride film with a thickness of 600 nm is formed as the insulating film 407 by a plasma CVD method. For example, the insulating film 407 was formed under the following deposition conditions: the flow rate of $SiH_4$ gas is 30 sccm and the flow rate of $N_2O$ gas is 4000 sccm; the pressure is 200 Pa; the RF power (power supply output) is 150 W; and the substrate temperature is 220° C.

The insulating film 407 may be subjected to dehydration or dehydrogenation treatment by heat treatment.

Even if a gas containing hydrogen is used as a film formation gas for the insulating film 407, hydrogen in the insulating film 407 can be removed by dehydrogenation treatment performed on the insulating film 407. Thus, a plasma CVD method can be preferably employed. By a plasma CVD method, a film can be deposited at relatively high deposition rate with less dust or the like attached to or mixed into the film in film deposition; accordingly, the film thickness can be increased, leading to advantages in productivity.

The temperature of the heat treatment is higher than or equal to 300° C. and lower than or equal to 700° C., or lower than the strain point of the substrate. The temperature of the heat treatment is preferably higher than the film formation temperature of an insulating film 496 because the film is more effectively dehydrated or dehydrogenated. For example, the substrate is put in an electric furnace which is a kind of heat treatment apparatus, and then the insulating film 496 is subjected to heat treatment at 450° C. for one hour under vacuum.

Note that the heat treatment apparatus is not limited to the electric furnace, and an apparatus for heating an object to be processed by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

The heat treatment may be performed under reduced pressure, under a nitrogen atmosphere, or under a rare gas atmosphere. It is preferable that water, hydrogen, and the like be not contained in the atmosphere of nitrogen, a rare gas, or the like. The purity of nitrogen or the rare gas which is introduced into the heat treatment apparatus is preferably 6N (99.9999%) or higher, further preferably 7N (99.99999%) or higher (that is, the impurity concentration is preferably lower than or equal to 1 ppm, further preferably lower than or equal to 0.1 ppm).

By the heat treatment, the insulating film 407 can be dehydrated or dehydrogenated, whereby the insulating film 407 from which impurities such as hydrogen and water is eliminated can be formed.

In the heat treatment where dehydration or dehydrogenation treatment is performed, it is preferable that a surface of the insulating film 407 be not in a state where hydrogen, water, or the like is prevented from being released (for example, by providing a film or the like which is not permeable to (or blocks) hydrogen, water, or the like), but in a state where the surface of the insulating film 407 is exposed.

The heat treatment for dehydration or dehydrogenation may be performed plural times and may double as another heat treatment.

Heat treatment for dehydration or dehydrogenation is performed, whereby impurities such as water and hydrogen contained in the insulating film 407 can be removed from the insulating film 407 and reduced in impurity concentration. When hydrogen is contained in the insulating film 407, entry of the hydrogen into the oxide semiconductor film 403 or extraction of oxygen from the oxide semiconductor film 403 by the hydrogen may occur; thus, the backchannel of the oxide semiconductor film 403 might have lower resistance (N-type conductivity) and a parasitic channel might be formed. Heat treatment for dehydration or dehydrogenation is performed, whereby the insulating film 407 can be a film containing hydrogen as little as possible. Consequently, variation in characteristics of the transistor 440 can be suppressed, and the transistor 440 can have stable electrical characteristics.

Oxygen doping treatment may be performed on the insulating film 407 which has been dehydrated or dehydrogenated. By the oxygen doping treatment on the insulating film 407, oxygen is supplied to the insulating film 407, so that oxygen is contained in the insulating film 407 and the vicinity of the interface.

The insulating film 407 preferably contains oxygen which exceeds at least the stoichiometric ratio in (a bulk of) the film.

By the oxygen doping treatment, the insulating film 407 can be a film containing much (excessive) oxygen (preferably, a film including a region containing oxygen in excess of the stoichiometric composition of a crystalline state), in which case the insulating film 407 can suitably function as the supply source of oxygen for the oxide semiconductor film 403.

The heat treatment is preferably performed while part (a channel formation region) of the oxide semiconductor film 403 is in contact with the insulating film 407. Through the heat treatment, oxygen can be supplied effectively from the insulating film 407 to the oxide semiconductor film 403.

In this embodiment, oxygen is introduced to the oxide semiconductor film 403 to be supplied thereto, so that the oxide semiconductor film 403 can be highly purified and be i-type (intrinsic).

The heating step is performed at a temperature higher than or equal to 250° C. and lower than or equal to 700° C., preferably higher than or equal to 400° C. and lower than or equal to 700° C., or lower than the strain point of the substrate. For example, the substrate is introduced into an electric furnace which is one of heat treatment apparatuses, and the heating step is performed on the oxide semiconductor film at 250° C. under a nitrogen atmosphere for an hour.

The heating step may be performed under reduced pressure, under a nitrogen atmosphere, under an oxygen atmosphere, in ultra dry air (air in which the moisture amount is less than or equal to 20 ppm (−55° C. by conversion into a dew point), preferably less than or equal to 1 ppm, further preferably less than or equal to 10 ppb, in the measurement with the use of a dew point meter in the cavity ring down laser spectroscopy (CRDS) system), or under a rare gas (argon, helium, or the like) atmosphere. It is preferable that water, hydrogen, and the like be not contained in the nitrogen atmosphere, in the oxygen atmosphere, in the ultra dry air, in the rare gas atmosphere, or the like. Alternatively, it is preferable that the purity of nitrogen, oxygen, or the rare gas which is introduced into the heat treatment apparatus be set to be 6N or higher (99.9999%), further preferably 7N or higher (99.99999%) (i.e., the concentration of impurities is lower than or equal to 1 ppm, preferably lower than or equal to 0.1 ppm).

Further, a dense inorganic insulating film may be provided over the insulating film 407. For example, an aluminum oxide film is formed over the insulating film 407 by a sputtering method. With a high-density aluminum oxide film (with a film density of 3.2 g/cm$^3$ or higher, preferably 3.6 g/cm$^3$ or higher), the electrical characteristics of the transistor 440 can be stabilized. The film density can be measured by Rutherford backscattering spectrometry (RBS) or X-ray reflection (XRR).

The aluminum oxide film which can be used as an insulating film provided over the transistor 440 has a high shielding effect (blocking effect) of preventing penetration of both oxygen and impurities such as hydrogen and moisture through the film.

Therefore, in and after the manufacturing process, the aluminum oxide film functions as a protective film for preventing entry of impurities such as hydrogen and moisture, which might cause variation in electrical characteristics, into the oxide semiconductor film 403, and release of oxygen which is a main component material of the oxide semiconductor from the oxide semiconductor film 403.

Further, a planarization insulating film may be formed thereover in order to reduce surface roughness due to the transistor 440. As the planarization insulating film, an organic material such as polyimide, acrylic, or a benzocyclobutene-based resin can be used. Other than such organic materials, it is also possible to use a low dielectric constant material (low-k material) or the like. Note that the planarization insulating film may be formed by stacking a plurality of insulating films formed from these materials.

For example, an acrylic resin film with a thickness of 1500 nm is formed as the planarization insulating film. The acrylic resin film can be formed by coating using a coating method and then baking (e.g., at 250° C. under a nitrogen atmosphere for an hour).

A heat treatment may be performed after the planarization insulating film is formed. For example, the heat treatment is performed at 250° C. under a nitrogen atmosphere for an hour.

As described above, a heat treatment may be performed after the transistor 440 is formed. The heat treatment may be performed more than once.

Variation in electrical characteristics is suppressed in the transistor 440 including an oxide semiconductor film having a spin density of 1×10$^{18}$ spins/cm$^3$ or lower, preferably 1×10$^{17}$ spins/cm$^3$ or lower, further preferably 1×10$^{16}$ spins/cm$^3$ or lower, and thus the transistor 440 is electrically stable.

Consequently, the transistor 440 having stable electrical characteristics can be manufactured.

Figure 3:
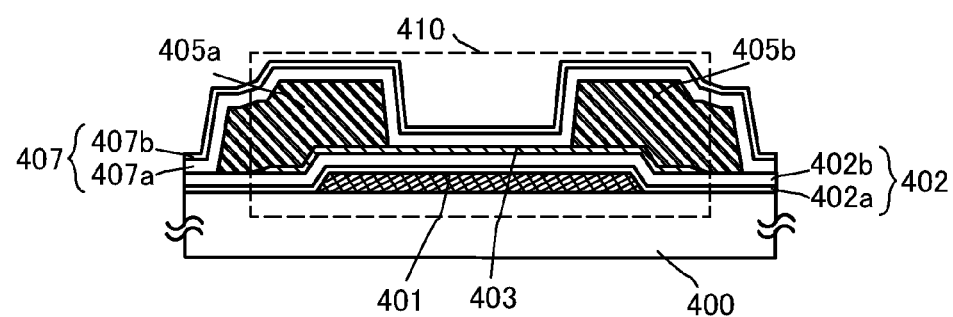
FIG. 3 is a cross-sectional view illustrating one embodiment of a semiconductor device.

As described above, the insulating film provided over and in contact with the gate insulating film and/or the oxide semiconductor film may have a staked-layer structure. FIG. 3 illustrates a transistor 410 in which the gate insulating film 402 and the insulating film 407 each have a staked-layer structure.

The transistor 410 illustrated in FIG. 3 includes the gate insulating film 402 and the insulating film 407. In the gate insulating film 402, a gate insulating film 402a and a gate insulating film 402b are stacked in this order from the gate electrode layer 401 side. In the insulating film 407, an insulating film 407a and an insulating film 407b are stacked in this order from the oxide semiconductor film 403 side.

In the staked-layer structure of the gate insulating film 402, at least the gate insulating film 402b which is in contact with the oxide semiconductor film 403 preferably contains much oxygen. Similarly, in the staked-layer structure of the insulating film 407, at least the insulating film 407a which is in contact with the oxide semiconductor film 403 preferably contains much oxygen. In the case where these films contain much oxygen, oxygen can be supplied from the insulating film in contact with the oxide semiconductor film 403 to the oxide semiconductor film 403, so that oxygen vacancies in the oxide semiconductor film 403 or at an interface between the oxide semiconductor film 403 and the insulating film in contact with the oxide semiconductor film 403 can be reduced.

In this embodiment, a silicon nitride oxide film is used as the gate insulating film 402b and the insulating film 407a.

The insulating film 407b functions as a protective film of the transistor 410. Thus, an aluminum oxide film is preferably provided as the insulating film 407b. Similarly, in the staked-layer structure of the gate insulating film 402, an aluminum oxide film is preferably provided as the gate insulating film 402a which is in contact with the gate electrode layer 401.

The aluminum oxide film has a high blocking effect and thus is less likely to transmit both oxygen and impurities such as hydrogen and moisture. Thus, the use of an aluminum oxide film as the gate insulating film 402a and the insulating film 407b can prevent elimination of oxygen from the oxide semiconductor film 403 and the gate insulating film 402b and the insulating film 407a which are in contact with the oxide semiconductor film 403 and entry of water and hydrogen into the oxide semiconductor film 403.

It is more preferable to use a high-density aluminum oxide film (with a film density of 3.2 g/cm$^3$ or higher, preferably 3.6 g/cm$^3$ or higher) because the electrical characteristics of the transistor 410 can be stable.

An insulating film containing reduced hydrogen and much oxygen is provided in contact with the oxide semiconductor film 403, and an insulating film having a blocking effect (in this embodiment, an aluminum oxide film) is provided outside the insulating film, so that electrical characteristics of the transistor can be more stable.

According to one embodiment of the present invention, a semiconductor device having the normally-off transistor 440 or the normally-off transistor 410 with favorable electrical characteristics and high reliability can be manufactured.

[Embodiment 2]

A semiconductor device with a display function (also referred to as a display device) can be manufactured using any of transistors described in Embodiment 1. Moreover, part or all of the driver circuit which includes the transistor can be formed over a substrate where a pixel portion is formed, whereby a system-on-panel can be formed.

Figure 4A:
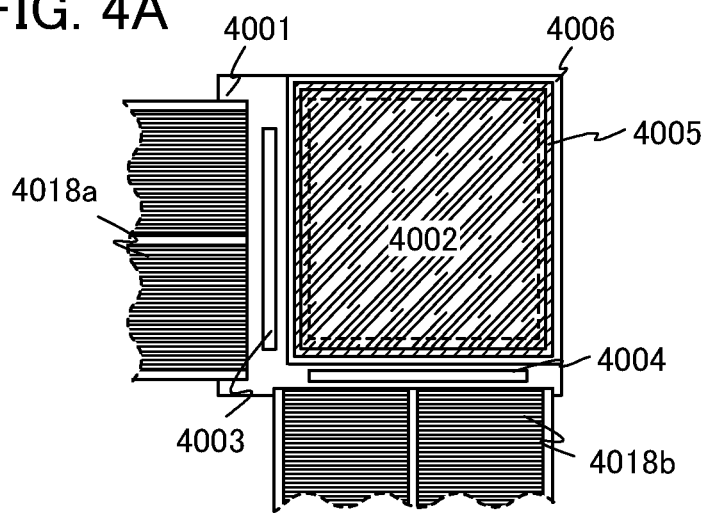
FIGS. 4A to 4C are plan views each illustrating one embodiment of a semiconductor device.

In FIG. 4A, a sealant 4005 is provided so as to surround a pixel portion 4002 provided over a substrate 4001, and the pixel portion 4002 is sealed with a substrate 4006. In FIG. 4A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region that is different from the region surrounded by the sealant 4005. A variety of signals and potentials are supplied to the signal line driver circuit 4003 and the scan line driver circuit 4004 which are separately formed and the pixel portion 4002 from flexible printed circuits (FPCs) 4018a and 4018b.

Figure 4B:
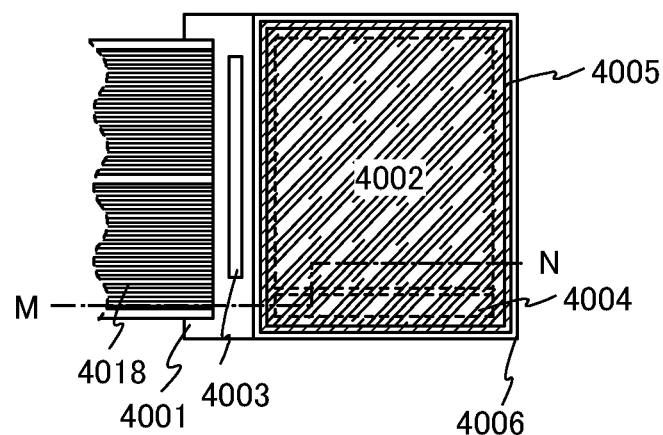
Figure 4C:
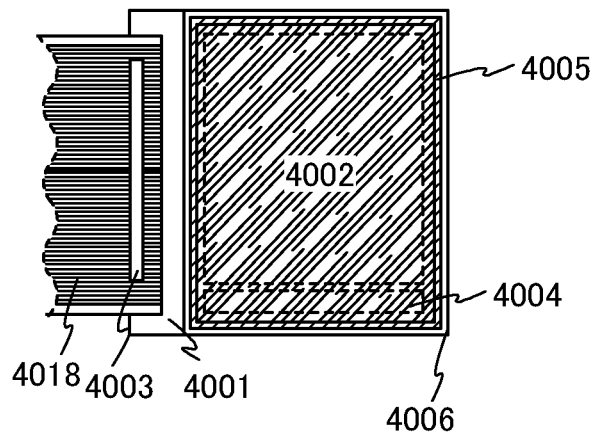

In FIGS. 4B and 4C, the sealant 4005 is provided so as to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIGS. 4B and 4C, the signal line driver circuit 4003 which is formed using a single crystal semiconductor film or a polycrystalline semiconductor film over an IC chip or a substrate separately prepared is mounted on the substrate 4001, in a region that is different from the region surrounded by the sealant 4005. In FIGS. 4B and 4C, a variety of signals and potentials are supplied from an FPC 4018 to the scan line driver circuit 4004 or the pixel portion 4002, and the signal line driver circuit 4003 which is separately formed.

Although FIGS. 4B and 4C each illustrate an example in which the signal line driver circuit 4003 is formed separately and mounted on the substrate 4001, one embodiment of the present invention is not limited to this structure. The scan line driver circuit may be formed separately and then mounted, or only part of the signal line driver circuit or only part of the scan line driver circuit may be formed separately and then mounted.

The connection method of such a separately formed driver circuit is not particularly limited; for example, a chip on glass (COG) method, a wire bonding method, or a tape automated bonding (TAB) method can be used.

FIG. 4A illustrates an example in which the signal line driver circuit 4003 and the scan line driver circuit 4004 are mounted by a COG method; FIG. 4B illustrates an example in which the signal line driver circuit 4003 is mounted by a COG method; and FIG. 4C illustrates an example in which the signal line driver circuit 4003 is mounted by a TAB method.

The display device includes in its category a panel in which a display element is sealed, and a module in which an IC including a controller or the like is mounted on the panel.

The display device in this specification means an image display device, a display unit, or a light source (including a lighting device). Furthermore, the display device also includes in its category the following modules: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the substrate include a plurality of transistors and any of transistors described in Embodiment 1 can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically includes an inorganic electroluminescent (EL) element, an organic EL element, and the like. A display medium whose contrast is changed by an electric effect, such as electronic ink, can also be used.

One embodiment of a semiconductor device is described with reference to FIGS. 4A to 4C, FIGS. 5A and 5B, and FIGS. 6A and 6B. FIGS. 6A and 6B are cross-sectional views taken along the line M-N of FIG. 4B.

As illustrated in FIGS. 6A and 6B, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as gate electrode layers of transistors 4010 and 4011.

Each of the pixel portion 4002 and the scan line driver circuit 4004 which are provided over the substrate 4001 includes a plurality of transistors. In FIGS. 6A and 6B, the transistor 4010 included in the pixel portion 4002 and the transistor 4011 included in the scan line driver circuit 4004 are illustrated as an example. An insulating film 4020 is provided over the transistors 4010 and 4011 in FIG. 6A, and an insulating film 4021 is further provided in FIG. 6B.

Any of the transistors described in Embodiment 1 can be applied to the transistors 4010 and 4011. In this embodiment, an example in which a transistor having a structure similar to that of the transistor 440 described in Embodiment 1 is used as each of the transistors 4010 and 4011 is described. The transistors 4010 and 4011 are each a staggered transistor having a bottom-gate structure.

The transistors 4010 and 4011 include an oxide semiconductor film having a spin density of $1\times10^{18}$ spins/cm$^3$ or lower, preferably $1\times10^{17}$ spins/cm$^3$ or lower, further preferably $1\times10^{16}$ spins/cm$^3$ or lower. Accordingly, the transistors 4010 and 4011 can be normally-off transistors having stable electrical characteristics.

Consequently, highly reliable semiconductor devices can be provided as semiconductor devices which include the transistors 4010 and 4011, which are illustrated in FIGS. 6A and 6B in this embodiment.

A conductive layer may be further provided so as to overlap with the channel formation region in the oxide semiconductor film of the transistor 4011 for the driver circuit. By providing the conductive layer so as to overlap with the channel formation region in the oxide semiconductor film, the amount of change in the threshold voltage of the transistor 4011 between before and after a bias-temperature stress test (BT test) can be further reduced. The conductive layer may have a potential the same as or a potential different from that of the gate electrode layer of the transistor 4011, and can function as a second gate electrode layer. The potential of the conductive layer may be GND or 0 V, or the conductive layer may be in a floating state.

The conductive layer also has a function of blocking an external electric field, that is, a function of preventing an external electric field (particularly, to prevent static electricity) from effecting the inside (a circuit portion including a transistor). A blocking function of the conductive layer can prevent the variation in electrical characteristics of the transistor due to the effect of external electric field such as static electricity.

The transistor 4010 included in the pixel portion 4002 is electrically connected to a display element to constitute a display panel. There is no particular limitation on the kind of the display element as long as display can be performed, and various kinds of display elements can be used.

An example of a liquid crystal display device using a liquid crystal element as a display element is illustrated in FIG. 6A. In FIG. 6A, a liquid crystal element 4013 which is a display element includes the first electrode layer 4030, a second electrode layer 4031, and a liquid crystal layer 4008. An insulating film 4032 and an insulating film 4033 functioning as alignment films are provided so that the liquid crystal layer 4008 is provided therebetween. The second electrode layer 4031 is provided on the substrate 4006 side, and the first electrode layer 4030 and the second electrode layer 4031 are stacked with the liquid crystal layer 4008 provided therebetween.

A spacer 4035 is a columnar spacer obtained by selective etching of an insulating film and is provided in order to control the film thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not used may be used for the liquid crystal layer 4008. In this case, the liquid crystal layer 4008 is in contact with the first electrode layer 4030 and the second electrode layer 4031. The blue phase is one of liquid crystal phases, which is generated just before a cholesteric phase changes into an isotropic phase while temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer can be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, so that the alignment process is not necessary and the viewing angle dependence is low. In addition, since an alignment film does not need to be provided and thus rubbing treatment is not necessary, electrostatic discharge damage caused by the rubbing treatment can be prevented and defects and damage of the liquid crystal display device in the manufacturing process can be reduced. Thus, the productivity of the liquid crystal display device can be improved. A transistor including an oxide semiconductor film has a possibility that the electrical characteristics of the transistor may fluctuate significantly by the influence of static electricity and deviate from the designed characteristics. Therefore, it is more effective to use a liquid crystal composition exhibiting a blue phase for the liquid crystal display device which includes the transistor including an oxide semiconductor film.

The specific resistivity of the liquid crystal material is greater than or equal to $1\times10^9$ $\Omega$·cm, preferably greater than or equal to $1\times10^{11}$ $\Omega$·cm, further preferably greater than or equal to $1\times10^{12}$ $\Omega$·cm. The resistivity in this specification is measured at 20° C.

The capacitance of a storage capacitor in the liquid crystal display device is set considering the leakage current of the transistor in the pixel portion or the like so that charge can be held for a predetermined period. The capacitance of the storage capacitor may be set considering the off-state current of the transistor or the like. By using a transistor including an oxide semiconductor film disclosed in this specification, a capacitance that is ⅓ or less, preferably ⅕ or less of liquid crystal capacitance of each pixel is enough as the capacitance of the storage capacitor.

In the transistor including an oxide semiconductor film disclosed in this specification, the current in an off state (off-state current) can be suppressed to be low. Accordingly, an electric signal such as an image signal can be held for a longer period, and a writing interval can be set longer in an on state. The frequency of refresh operation can be accordingly reduced, which leads to an effect of suppressing power consumption.

Further, in the transistor including an oxide semiconductor film disclosed in this specification, relatively high field-effect mobility can be obtained; thus, the transistor can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode; for example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarizer, which consists of a polarizing substrate and a retardation substrate, may be provided. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. The disclosed invention is not limited to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. Such a light-emitting element is called a current-excitation light-emitting element owing to such a mechanism. In this embodiment, an example in which an organic EL element is used as the light-emitting element is described.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An organic EL element is used as the light-emitting element for description here.

To extract light emitted from the light-emitting element, it is necessary that at least one of the pair of electrodes have a light-transmitting property. A transistor and the light-emitting element are formed over a substrate. The light-emitting element can employ any of the following emission structures: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

Examples of a light-emitting device in which a light-emitting element is used as a display element are illustrated in FIGS. 5A and 5B and FIG. 6B.

FIG. 5A is a plan view of the light-emitting device, and FIG. 5B is a cross-sectional view taken along the chain lines S1-T1, S2-T2, and S3-T3 in FIG. 5A. Note that in the plan view in FIG. 5A, an electroluminescent layer 542 and a second electrode layer 543 are not illustrated.

The light-emitting device illustrated in FIGS. 5A and 5B includes, over a substrate 500, a transistor 510, a capacitor 520, and an intersection 530 of wiring layers. The transistor 510 is electrically connected to a light-emitting element 540. Note that FIGS. 5A and 5B illustrate a bottom-emission light-emitting device in which light from the light-emitting element 540 is extracted through the substrate 500.

Any of the transistors described in Embodiment 1 can be applied to the transistor 510. In this embodiment, an example in which a transistor having a structure similar to that of the transistor 440 described in Embodiment 1 is used is described. The transistor 510 is a staggered transistor having a bottom-gate structure.

The transistor 510 includes gate electrode layers 511a and 511b, a gate insulating film 502, an oxide semiconductor film 512, and conductive layers 513a and 513b each functioning as a source electrode layer or a drain electrode layer.

The transistor 510 includes an oxide semiconductor film having a spin density of $1\times10^{18}$ spins/cm$^3$ or lower, preferably $1\times10^{17}$ spins/cm$^3$ or lower, further preferably $1\times10^{16}$ spins/cm$^3$ or lower. Accordingly, the transistor 510 can be a normally-off transistor having stable electrical characteristics.

Consequently, a semiconductor device including the transistor 510 illustrated in FIGS. 5A and 5B in this embodiment can have high reliability.

The capacitor 520 includes conductive layers 521a and 521b, the gate insulating film 502, an oxide semiconductor film 522, and a conductive layer 523. The gate insulating film 502 and the oxide semiconductor film 522 are sandwiched between the conductive layer 523 and the conductive layers 521a and 521b, so that the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating film 502 provided therebetween.

In this embodiment, a titanium film with a thickness of 30 nm is used as the gate electrode layer 511a and the conductive layer 521a, and a copper thin film with a thickness of 200 nm is used as the gate electrode layer 511b and the conductive layer 521b. Thus, the gate electrode layer has a layered structure of a titanium film and a copper thin film.

An IGZO film with a thickness of 25 nm is used as the oxide semiconductor films 512 and 522.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a layered structure in which a first electrode layer 541, the electroluminescent layer 542, and the second electrode layer 543 are stacked in this order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 are electrically connected to each other. Note that a partition 507 is provided so as to cover part of the first electrode layer 541 and the opening.

As the interlayer insulating film 504, a silicon oxynitride film with a thickness larger than or equal to 200 nm and smaller than or equal to 600 nm, which is formed by a plasma CVD method can be used. Further, a photosensitive acrylic film with a thickness of 1500 nm and a photosensitive polyimide film with a thickness of 1500 nm can be used as the insulating film 506 and the partition 507, respectively.

As the color filter layer 505, for example, a chromatic light-transmitting resin can be used. As such a chromatic light-transmitting resin, a photosensitive organic resin or a non-photosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the thickness of the color filter layer 505 may be larger than or equal to 1500 nm and smaller than or equal to 2000 nm.

In the light-emitting device illustrated in FIG. 6B, a light-emitting element 4513 which is a display element is electrically connected to the transistor 4010 provided in the pixel portion 4002. A structure of the light-emitting element 4513 is not limited to the illustrated layered structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition 4510 and the partition 507 are formed using an organic insulating material or an inorganic insulating material. It is particularly preferable that the partition 4510 and the partition 507 be formed using a photosensitive resin material to have openings over the first electrode layer 4030 and the first electrode layer 541, respectively, so that a sidewall of each opening is formed as a tilted surface with continuous curvature.

The electroluminescent layers 4511 and 542 may be formed using either a single layer or a plurality of layers stacked.

A protective film may be formed over the second electrode layer 4031 and the partition 4510 and over the second electrode layer 543 and the partition 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, or the like do not enter the light-emitting elements 4513 and 540.

In addition, in a space which is formed with the substrate 4001, the substrate 4006, and the sealant 4005, a filler 4514 is provided for sealing. It is preferable that the light-emitting elements 4513 and 540 be packaged (sealed) with a protective film (such as a laminate film or an ultraviolet curable resin film) or a cover material with high air-tightness and little degasification so that the light-emitting elements 4513 and 540 are not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, if necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also called electrophoretic display device (electrophoretic display) and is advantageous in that it exhibits the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particles and the second particles each contain a pigment and do not move without an electric field. Moreover, the first particles and the second particles have different colors (which may be colorless).

Thus, an electrophoretic display device is a display device that utilizes a dielectrophoretic effect by which a substance having a high dielectric constant moves to a high electric field region.

A solution in which the above microcapsules are dispersed in a solvent is referred to as electronic ink. This electronic ink can be printed on a surface of glass, plastic, cloth, paper, or the like. Further, by using a color filter or particles that have a pigment, color display can also be achieved.

The first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 4A to 4C, FIGS. 5A and 5B, and FIGS. 6A and 6B, a flexible substrate as well as a glass substrate can be used as the substrates 4001, 500, and 4006. For example, a light-transmitting plastic substrate or the like can be used. As plastic, a fiberglass-reinforced plastics (FRP) plate, a polyvinyl fluoride (PVF) film, a polyester film, or an acrylic resin film can be used. In the case where the light-transmitting property is not necessary, a metal substrate (metal film) of aluminum, stainless steel, or the like may be used. For example, a sheet with a structure in which an aluminum foil is sandwiched between PVF films or polyester films can be used.

In this embodiment, a silicon oxynitride film formed by a plasma CVD method is used as the insulating film 4020.

It is preferable that an aluminum oxide film be formed over the silicon oxynitride film and then heat treatment be performed.

The aluminum oxide film has a high shielding effect (blocking effect) of preventing penetration of both oxygen and impurities such as hydrogen and moisture through the film.

Therefore, in and after the manufacturing process, the aluminum oxide film functions as a protective film for preventing entry of impurities such as hydrogen and moisture, which might cause variation, into the silicon oxynitride film, and release of oxygen.

The insulating films 4021 and 506 each functioning as a planarization insulating film can be formed using an organic material having heat resistance, such as acrylic, polyimide, a benzocyclobutene-based resin, polyamide, or epoxy. Other than such organic materials, it is also possible to use a low-dielectric constant material (low-k material), a siloxane-based resin, phosphosilicate glass (PSG), borophosphosilicate glass (BPSG), or the like. Note that the insulating films may be formed by stacking a plurality of insulating films formed from these materials.

There is no particular limitation on the method of forming the insulating films 4021 and 506, and the following method or tool (equipment) can be used depending on the material: a sputtering method, spin coating, dipping, spray coating, a droplet discharge method (such as an ink-jet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layers 4030 and 541 and the second electrode layers 4031 and 543 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride of these metals.

In this embodiment, since the light-emitting device illustrated in FIGS. 5A and 5B have a bottom-emission structure, the first electrode layer 541 has a light-transmitting property and the second electrode layer 543 has a light-reflecting property. Accordingly, in the case of using a metal film as the first electrode layer 541, the film is preferably made thin enough to secure a light-transmitting property; and in the case of using a light-transmitting conductive film as the second electrode layer 543, a light-reflecting conductive film is preferably stacked therewith.

A conductive composition containing a conductive high molecule (also called a conductive polymer) can be used for the first electrode layers 4030 and 541 and the second electrode layers 4031 and 543. As the conductive high molecule, a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken owing to static electricity or the like, a protection circuit for protecting the driver circuit is preferably provided. The protection circuit is preferably formed using a nonlinear element.

By applying any of the transistors described in Embodiment 1 as described above, semiconductor devices having a variety of functions can be provided.

The structures, methods, and the like described in this embodiment can be combined as appropriate with any of the structures, methods, and the like described in the other embodiments.

[Embodiment 3]

A semiconductor device having an image sensor function for reading data of an object can be formed with the use of any of the transistors described in Embodiment 1.

Figure 7A:
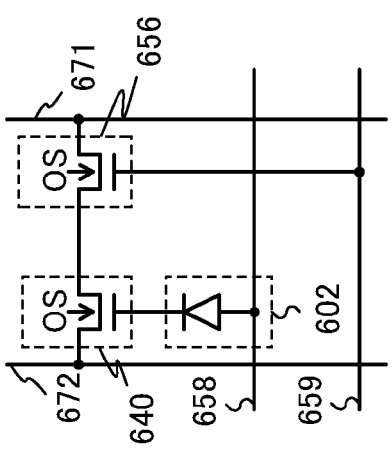
FIGS. 7A and 7B are a circuit diagram and a cross-sectional view of one embodiment of a semiconductor device.
Figure 7B:
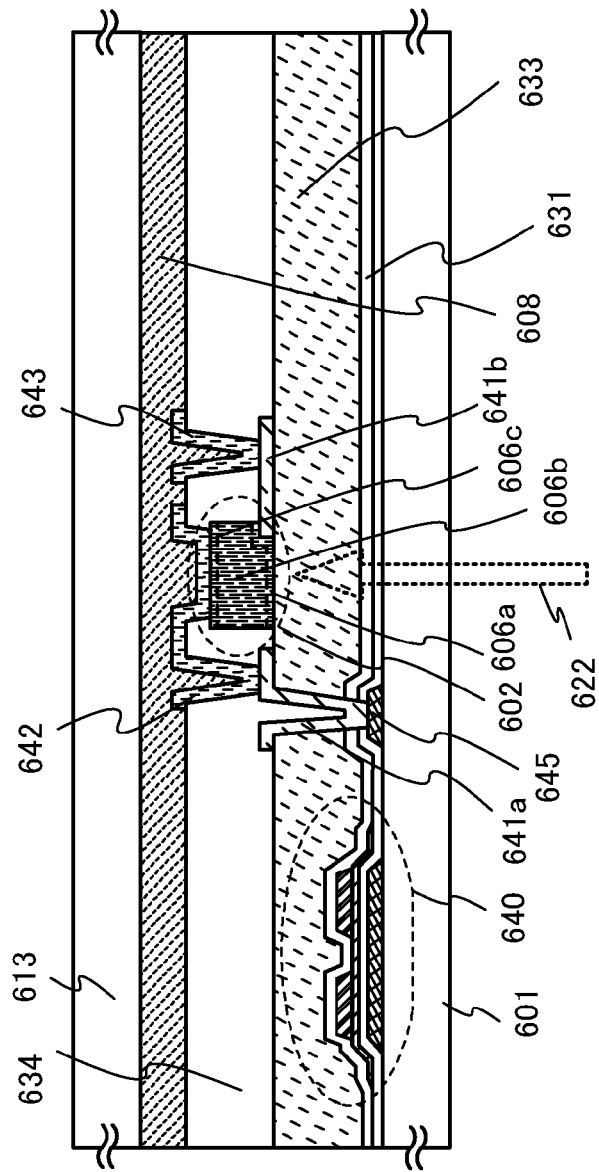

FIGS. 7A and 7B illustrate an example of a semiconductor device having an image sensor function. FIG. 7A is an equivalent circuit diagram of a photosensor, and FIG. 7B is a cross-sectional view of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

In the circuit diagrams in this specification, a transistor including an oxide semiconductor film is denoted by a symbol "OS" so that it can be clearly identified as a transistor including an oxide semiconductor film. In FIG. 7A, the transistors 640 and 656 are transistors each including an oxide semiconductor film, to which any of the transistors described in Embodiment 1 can be applied. This embodiment illustrates an example in which a transistor having a structure similar to that of the transistor 440 described in Embodiment 1 is used.

The transistors 640 and 656 are each a staggered transistor having a bottom-gate structure.

FIG. 7B is a cross-sectional view of the photodiode 602 and the transistor 640 in the photosensor. The transistor 640 and the photodiode 602 functioning as a sensor are provided over a substrate 601 (an element substrate) having an insulating surface. A substrate 613 is provided over the photodiode 602 and the transistor 640 with the use of an adhesive layer 608.

An insulating film 631, an interlayer insulating film 633, and an interlayer insulating film 634 are provided over the transistor 640. The photodiode 602 is provided over the interlayer insulating film 633. In the photodiode 602, a first semiconductor film 606*a*, a second semiconductor film 606*b*, and a third semiconductor film 606*c* are stacked in this order from the interlayer insulating film 633 side, between electrode layers 641*a* and 641*b* formed over the interlayer insulating film 633 and an electrode layer 642 formed over the interlayer insulating film 634.

The electrode layer 641*b* is electrically connected to a conductive layer 643 formed over the interlayer insulating film 634, and the electrode layer 642 is electrically connected to a conductive layer 645 through the electrode layer 641*a*. The conductive layer 645 is electrically connected to the gate electrode layer of the transistor 640, and the photodiode 602 is electrically connected to the transistor 640.

Here, a pin photodiode in which a semiconductor film having p-type conductivity as the first semiconductor film 606*a*, a high-resistance semiconductor film (i-type semiconductor film) as the second semiconductor film 606*b*, and a semiconductor film having n-type conductivity as the third semiconductor film 606*c* are stacked is illustrated as an example.

The first semiconductor film 606*a* is a p-type semiconductor film and can be formed using an amorphous silicon film containing an impurity element imparting p-type conductivity. The first semiconductor film 606*a* is formed by a plasma CVD method with the use of a semiconductor source gas containing an impurity element belonging to Group 13 (e.g., boron (B)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed to diffuse the impurity element after the impurity element is added by an ion implantation method or the like. In that case, as a method of forming the amorphous silicon film, an LPCVD method, a vapor deposition method, a sputtering method, or the like may be used. The first semiconductor film 606*a* is preferably formed with a thickness larger than or equal to 10 nm and smaller than or equal to 50 nm.

The second semiconductor film 606*b* is an i-type semiconductor film (intrinsic semiconductor film) and is formed using an amorphous silicon film. As for formation of the second semiconductor film 606*b*, an amorphous silicon film is formed by a plasma CVD method with the use of a semiconductor source gas. As the semiconductor source gas, silane ($SiH_4$) can be used. Alternatively, $Si_2H_6$, $SiH_2Cl_2$, $SiHCl_3$, $SiCl_4$, $SiF_4$, or the like may be used. The second semiconductor film 606*b* may be formed by an LPCVD method, a vapor deposition method, a sputtering method, or the like. The second semiconductor film 606*b* is preferably formed with a thickness larger than or equal to 200 nm and smaller than or equal to 1000 nm.

The third semiconductor film 606*c* is an n-type semiconductor film and can be formed using an amorphous silicon film containing an impurity element imparting n-type conductivity. The third semiconductor film 606*c* is formed by a plasma CVD method with the use of a semiconductor source gas containing an impurity element belonging to Group 15 (e.g., phosphorus (P)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed to diffuse the impurity element after the impurity element is added by an ion implantation method or the like. In that case, as a method of forming the amorphous silicon film, an LPCVD method, a vapor deposition method, a sputtering method, or the like can be used. The third semiconductor film 606*c* is preferably formed with a thickness larger than or equal to 20 nm and smaller than or equal to 200 nm.

The first semiconductor film 606*a*, the second semiconductor film 606*b*, and the third semiconductor film 606*c* are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is formed using a light-blocking conductive film. A surface on the n-type semiconductor film side can alternatively be used as the light-receiving plane.

With the use of an insulating material, the insulating film 631, the interlayer insulating film 633, and the interlayer insulating film 634 can be formed using the following method depending on the material: a sputtering method, a plasma CVD method, spin coating, dipping, spray coating, a droplet discharge method (such as an ink-jet method), or a printing method (such as screen printing or offset printing).

The insulating film 631 can be a single layer or a stacked layer including an inorganic insulating film. Examples of the inorganic insulating films are an oxide insulating film (e.g., a silicon oxide layer, a silicon oxynitride layer, an aluminum oxide layer, and an aluminum oxynitride layer) and a nitride insulating film (e.g., a silicon nitride layer, a silicon nitride oxide layer, an aluminum nitride layer, and an aluminum nitride oxide layer).

In this embodiment, a silicon oxynitride film formed by a plasma CVD method is used as the insulating film 631.

It is preferable that an aluminum oxide film be formed over the silicon oxynitride film and then heat treatment be performed.

The aluminum oxide film has a high shielding effect (blocking effect) of preventing penetration of both oxygen and impurities such as hydrogen and moisture through the film.

Therefore, in and after the manufacturing process, the aluminum oxide film functions as a protective film for preventing entry of impurities such as hydrogen and moisture, which might cause variation, into the silicon oxynitride film, and release of oxygen.

To reduce surface roughness, an insulating film functioning as a planarization insulating film is preferably used as each of the interlayer insulating films 633 and 634. For the interlayer insulating films 633 and 634, for example, an organic insulating material having heat resistance, such as polyimide, acrylic, a benzocyclobutene-based resin, polyamide, or epoxy, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light 622 that enters the photodiode 602, data on an object to be detected can be read. A light source such as a backlight can be used at the time of reading data on the object to be detected.

The transistor 640 includes an oxide semiconductor film having a spin density of $1\times10^{18}$ spins/cm$^3$ or lower, preferably $1\times10^{17}$ spins/cm$^3$ or lower, further preferably $1\times10^{16}$ spins/cm$^3$ or lower. Accordingly, the transistor 640 can be a normally-off transistor having stable electrical characteristics.

Consequently, a semiconductor device including the transistor 640 in this embodiment can have high reliability.

The structures, methods, and the like described in this embodiment can be combined as appropriate with any of the structures, methods, and the like described in the other embodiments.

[Embodiment 4]

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), and a game console. Specific examples of these electronic devices are illustrated in FIGS. 8A to 8C.

Figure 8A:
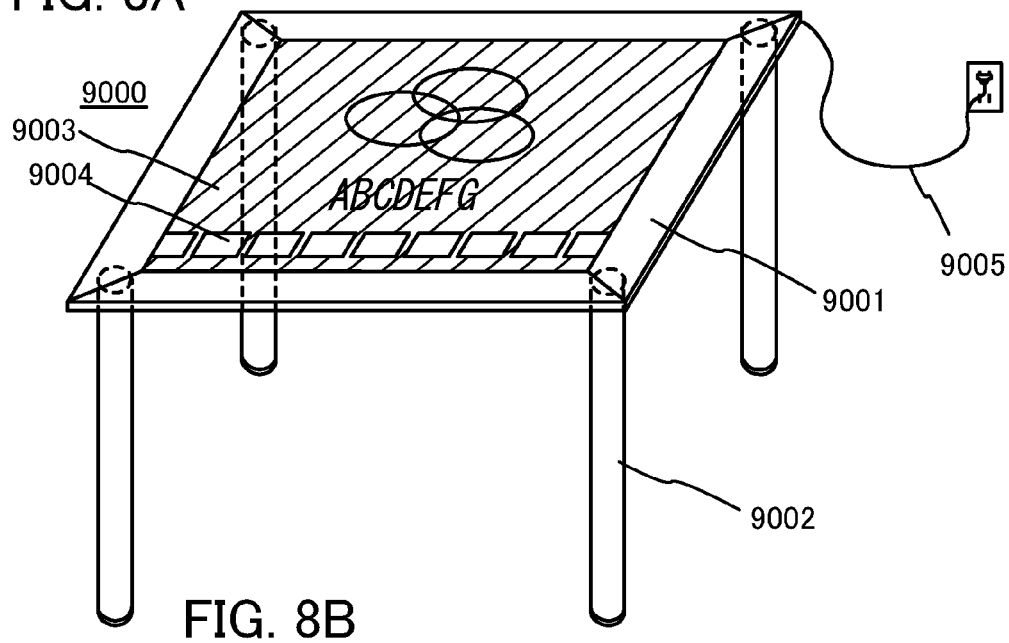
FIGS. 8A to 8C each illustrate an electronic device.
Figure 8B:
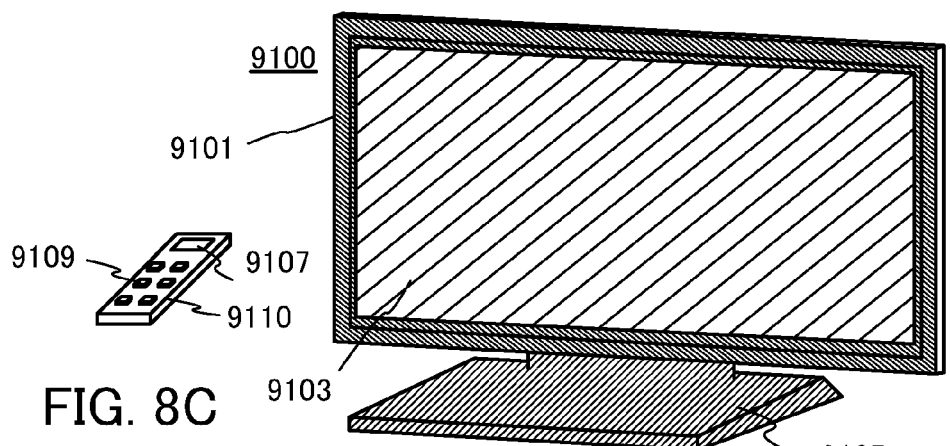
Figure 8C:
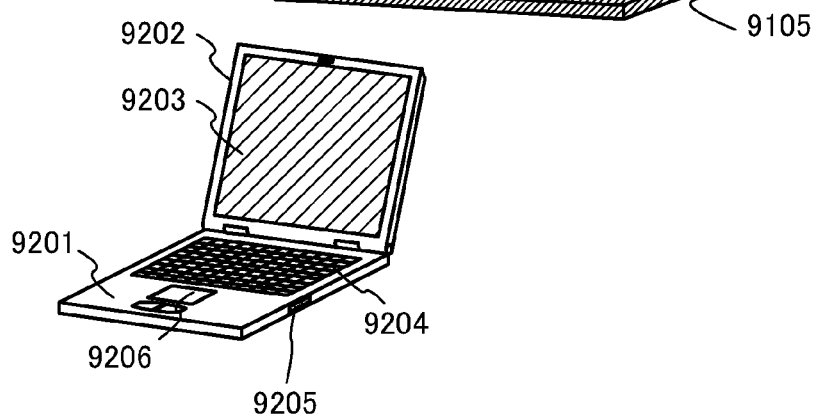

FIG. 8A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 1 to 3 can be used for the display portion 9003 so that the electronic device can have a high reliability.

The display portion 9003 has a touch-input function. When users touch displayed buttons 9004 which are displayed on the display portion 9003 of the table 9000 with their fingers or the like, the users can carry out operation of the screen and input of data. Further, when the table may be made to communicate with home appliances or control the home appliances, the display portion 9003 may function as a control device which controls the home appliances by operation on the screen. For example, with the use of the semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television set. When a television device having a large screen is set in a small room, an open space is reduced; however, when a display portion is incorporated in the table, a space in the room can be efficiently used.

FIG. 8B illustrates a television set 9100. In the television set 9100, a display portion 9103 is incorporated in a housing 9101 and an image can be displayed on the display portion 9103. Note that here the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 8B is provided with a receiver, a modem, and the like. With the receiver, the television set 9100 can receive a general television broadcast. Further, when the television set 9100 is connected to a communication network with or without wires connection via the modem, one-way (from a transmitter to a receiver) or two-way (between a transmitter and a receiver or between receivers) data communication can be performed.

The semiconductor device described in any of Embodiments 1 to 3 can be used for the display portions 9103 and 9107 so that the television set and the remote controller can have a high reliability.

FIG. 8C illustrates a computer, which includes a main body 9201, a housing 9202, a display portion 9203, a keyboard 9204, an external connection port 9205, a pointing device 9206, and the like.

The semiconductor device described in any of Embodiments 1 to 3 can be used for the display portion 9203 so that the computer can have a high reliability.

Figure 9A:
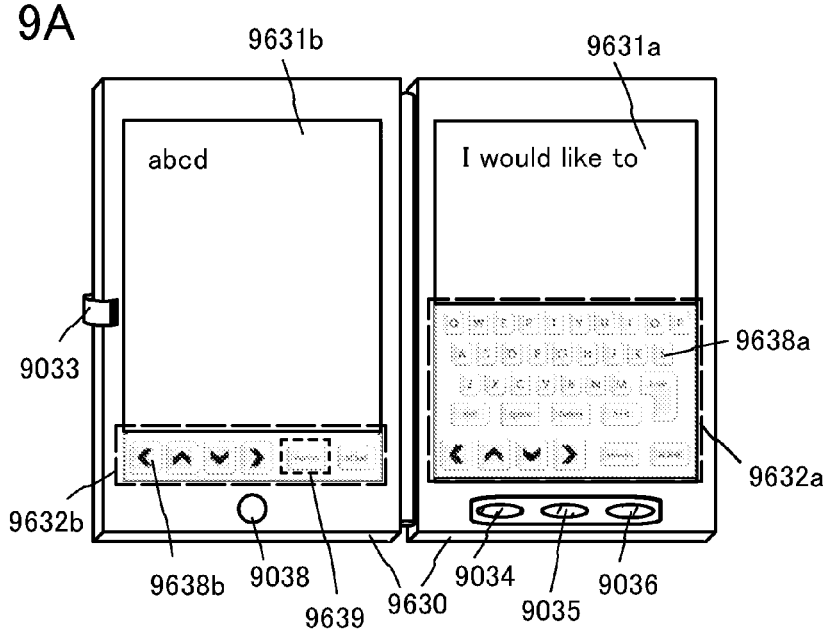
FIGS. 9A to 9C illustrate an electronic device.
Figure 9B:
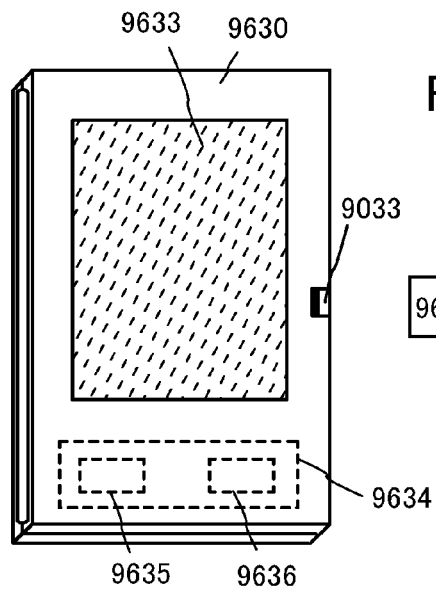

FIGS. 9A and 9B illustrate an example of a foldable tablet. FIG. 9A illustrates the tablet which is unfolded. The tablet includes a housing 9630, a display portion 9631*a*, a display portion 9631*b*, a display mode switch 9034, a power switch 9035, a power-saving mode switch 9036, a clasp 9033, and an operation switch 9038.

The semiconductor device described in any of Embodiments 1 to 3 can be used for the display portions 9631*a* and 9631*b* so that the tablet terminal can have a high reliability.

Part of the display portion 9631*a* can be a touch panel region 9632*a*, and data can be input by touching operation keys 9638*a* that are displayed. Although a structure in which a half region in the display portion 9631*a* has only a display function and the other half region has a touch panel function is shown as an example, the display portion 9631*a* is not limited to this structure. The whole region in the display portion 9631*a* may have a touch panel function. For example, the display portion 9631*a* can display a keyboard in the whole region to be a touch panel, and the display portion 9631*b* can be used as a display screen.

In a manner similar to that of the display portion 9631*a*, part of the display portion 9631*b* can be a touch panel region 9632*b*, and data can be input by touching operation keys 9638*b* that are displayed. When a keyboard display switching instruction portion 9639 displayed on the touch panel is touched with a finger, a stylus, or the like, a keyboard can be displayed on the display portion 9631*b*.

Touch input can be performed in the touch panel region 9632*a* and the touch panel region 9632*b* at the same time.

The switch 9034 for switching display modes can switch the display between a portrait mode and a landscape mode, and between monochrome display and color display, for example. The switch 9036 for switching to power-saving mode can control display luminance to be optimal in accordance with the amount of external light in use of the tablet terminal which is detected by an optical sensor incorporated in the tablet terminal. Another detection device including a sensor for detecting inclination, such as a gyroscope or an acceleration sensor, may be incorporated in the tablet terminal, in addition to the optical sensor.

Although the display portion 9631a and the display portion 9631b have the same display area in FIG. 9A, one embodiment of the present invention is not particularly limited to this example. The display portion 9631a and the display portion 9631b may have different areas or different display quality. For example, higher definition images may be displayed on one of the display portions 9631a and 9631b.

FIG. 9B illustrates the tablet terminal which is folded, which includes the housing 9630, a solar battery 9633, a charge and discharge control circuit 9634, a battery 9635, and a DC-DC converter 9636. As an example, FIG. 9B illustrates the charge and discharge control circuit 9634 including the battery 9635 and the DC-DC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 9A and 9B can also have a function of displaying various kinds of data (e.g., a still image, a moving image, and a text image), a function of displaying a calendar, the date, the time, or the like on the display portion, a touch-input function of operating or editing data displayed on the display portion by touch input, a function of controlling processing by various kinds of software (programs), and the like.

The solar battery 9633, which is attached on a surface of the tablet terminal, can supply electric power to a touch panel, a display portion, an image signal processor, and the like. Note that the solar battery 9633 can be provided on one or two surfaces of the housing 9630, so that the battery 9635 can be charged efficiently. The use of a lithium ion battery as the battery 9635 is advantageous in downsizing or the like.

Figure 9C:
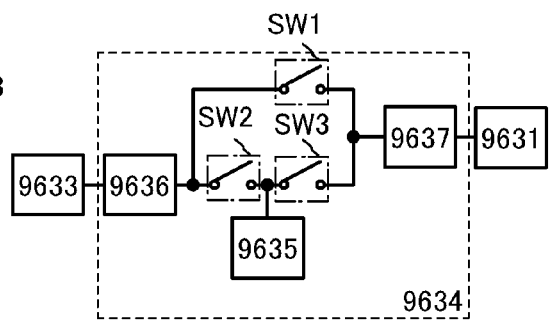

The structure and operation of the charge and discharge control circuit 9634 illustrated in FIG. 9B are described with reference to a block diagram in FIG. 9C. FIG. 9C illustrates the solar battery 9633, the battery 9635, the DC-DC converter 9636, a converter 9637, switches SW1 to SW3, and a display portion 9631. The battery 9635, the DC-DC converter 9636, the converter 9637, and the switches SW1 to SW3 correspond to the charge and discharge control circuit 9634 illustrated in FIG. 9B.

First, an example of operation in the case where power is generated by the solar battery 9633 using external light is described. The voltage of power generated by the solar battery 9633 is raised or lowered by the DC-DC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

The structures, methods, and the like described in this embodiment can be combined as appropriate with any of the structures, methods, and the like described in the other embodiments.

EXAMPLE 1

In this example, the spin density and the conductivity of an oxide semiconductor film were measured. As samples, Example Sample and Comparative Sample were formed.

An IGZO film with a thickness of 100 nm was formed as the oxide semiconductor film over a quartz substrate by a sputtering method using an oxide target with the following atomic ratio, In:Ga:Zn=1:1:1. The formation conditions were as follows: the atmosphere was an atmosphere of argon and oxygen (argon: oxygen=100 sccm: 100 sccm), the pressure was 0.6 Pa, the power was 5 kW, and the substrate temperature was 170° C.

The oxide semiconductor film was subjected to heat treatment under a nitrogen atmosphere at 350° C. for one hour and then was subjected to heat treatment under an atmosphere of nitrogen and oxygen at 350° C. for one hour.

A silicon oxynitride film with a thickness of 400 nm was formed over the oxide semiconductor film by a plasma CVD method.

The silicon oxynitride film of Example Sample was formed under the following deposition conditions: the flow rate of $SiH_4$ gas was 30 sccm and the flow rate of $N_2O$ gas was 3000 sccm; the pressure was 200 Pa; the RF power (power supply output) was 150 W; and the substrate temperature was 220° C.

The silicon oxynitride film of Comparative Sample was formed under the following deposition conditions: the flow rate of $SiH_4$ gas was 30 sccm and the flow rate of $N_2O$ gas was 3000 sccm; the pressure was 40 Pa; the RF power (power supply output) was 150 W; and the substrate temperature was 220° C.

An opening reaching the oxide semiconductor film was formed in the silicon oxynitride film, and a conductive layer was formed in the opening. The conductive layer had a stack of a 100-nm-thick titanium film, a 400-nm-thick aluminum film, and a 100-nm-thick titanium film.

The spin density of the oxide semiconductor films in Example Sample and Comparative Sample was measured by electron spin resonance (ESR). The measurement conditions were as follows. The temperature was 25° C., the power of microwaves (9.2 GHz) was 20 mW, the direction of a magnetic field was parallel to a surface of each of the oxide semiconductor films, and the lower limit of the detection range was $1.0 \times 10^{17}$ spins/$cm^3$. Further, the conductivity of the oxide semiconductor films in Example Sample and Comparative Sample was measured.

Figure 10:
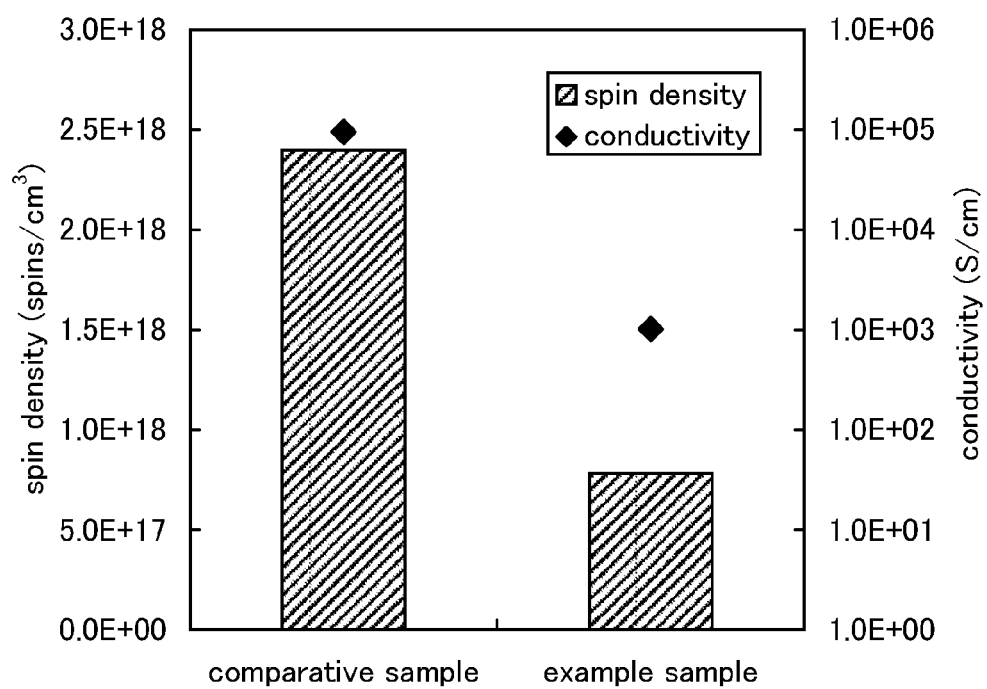
FIG. 10 shows the spin density and the conductivity of oxide semiconductor films.

FIG. 10 shows the spin density (bar graphs) and the conductivity (rhombic dots) of Example Sample and Comparative Sample.

The spin density of the oxide semiconductor film of Example Sample was $7.8 \times 10^{17}$ spins/$cm^3$, which was in the range of $1.0 \times 10^{18}$ spins/$cm^3$ or lower. In contrast, the spin density of the oxide semiconductor film of Comparative Sample was $2.4 \times 10^{18}$ spins/$cm^3$, which was in the range of $1.0 \times 10^{18}$ spins/$cm^3$ or higher.

The conductivity of the oxide semiconductor film of Example Sample was $1.0 \times 10^3$ S/$cm^3$, which was in the range of $1.0 \times 10^3$ S/$cm^3$ or lower. The conductivity of the oxide semiconductor film of Example Sample was $9.5 \times 10^4$ S/$cm^3$, which was in the range of $1.0 \times 10^3$ S/$cm^3$ or higher.

The oxide semiconductor film of Example Sample has a low spin density, few defects, and a low conductivity. With the oxide semiconductor film, the normally-off transistor having favorable electrical characteristics can be provided.

EXAMPLE 2

In this example, a transistor including an oxide semiconductor film was formed and the electrical characteristics thereof were evaluated.

As the transistor used for evaluation, Example Transistor and Comparative Transistor were formed to have a similar structure to the transistor 440 illustrated in FIGS. 1A and 1B. Methods for forming Example Transistor and Comparative Transistor are described below.

A silicon nitride film with a thickness of 100 nm and a silicon nitride oxide film with a thickness of 150 nm were formed by a plasma CVD method as an insulating layer over a glass substrate. The silicon nitride film was formed under the following deposition conditions: the flow rate of $SiH_4$ gas was 30 sccm, the flow rate of $H_2$ gas was 800 sccm, and the flow rate of $NH_3$ gas was 300 sccm; the power for film formation (RF) was 600 W; the film formation pressure was 60 Pa; and the substrate temperature was 330° C. The silicon nitride oxide film was formed under the following deposition conditions: the flow rate of $SiH_4$ gas was 10 sccm, and the flow rate of $N_2O$ gas was 1200 sccm; the power for film formation (RF) was 30 W; the film formation pressure was 22 Pa; and the substrate temperature was 330° C.

A tungsten film with a thickness of 100 nm was formed over the insulating layer by a sputtering method, and was etched by an etching method to form a gate electrode layer.

A silicon oxynitride film with a thickness of 100 nm was formed over the gate electrode layer by a high-density plasma CVD method to form a gate insulating film. The silicon oxynitride film was formed under the following deposition conditions: the flow rate of $SiH_4$ gas was 250 sccm, the flow rate of $N_2O$ gas was 2500 sccm, and the flow rate of Ar gas was 2500 sccm; the pressure was 30 Pa; the substrate temperature was 325° C.; the power was 5 kW (the frequency: 2.45 GHz, the number of power sources: 4); and the distance between an electrode and the substrate was 160 mm.

An IGZO film with a thickness of 25 nm was formed as an oxide semiconductor film over the gate insulating film by a sputtering method using an oxide target with the following atomic ratio, In:Ga:Zn=1:1:1. The formation conditions were as follows: the atmosphere was an atmosphere of argon and oxygen (argon: oxygen=100 sccm: 100 sccm), the pressure was 0.6 Pa, the power was 5 kW, and the substrate temperature was 170° C.

Heat treatment was performed at 170° C. for four minutes under vacuum before the IGZO film was formed. Through this heat treatment, water adsorbed on the surface of the gate insulating film can be removed.

The IGZO film was processed into an island shape by a wet etching method, so that an oxide semiconductor film was formed.

The oxide semiconductor film was subjected to heat treatment under a nitrogen atmosphere at 450° C. for one hour and then was subjected to heat treatment under an atmosphere of nitrogen and oxygen at 350° C. for one hour.

A stack of a 100-nm-thick titanium film, a 400-nm-thick aluminum film, and a 100-nm-thick titanium film was formed as a conductive layer over the oxide semiconductor film by a sputtering method, and was processed by etching to form a source electrode layer and a drain electrode layer.

After that, heat treatment was performed under a nitrogen atmosphere at 300° C. for one hour.

A silicon oxynitride film with a thickness of 600 nm was formed as an insulating film to cover the oxide semiconductor film, the source electrode layer, and the drain electrode layer by a plasma CVD method.

The silicon oxynitride film of Example Transistor was formed under the following deposition conditions: the flow rate of $SiH_4$ gas was 30 sccm and the flow rate of $N_2O$ gas was 4000 sccm; the pressure was 200 Pa; the RF power (power supply output) was 150 W; and the substrate temperature was 220° C.

The silicon oxynitride film of Comparative Transistor was formed under the following deposition conditions: the flow rate of $SiH_4$ gas was 30 sccm and the flow rate of $N_2O$ gas was 4000 sccm; the pressure was 40 Pa; the RF power (power supply output) was 150 W; and the substrate temperature was 220° C.

In each of Example Transistor and Comparative Transistor, a silicon oxide film was formed over the silicon oxynitride film by a sputtering method, and heat treatment was performed under an atmosphere of nitrogen and oxygen at 300° C. for one hour. Then, an acrylic resin layer was formed over the silicon oxide film and an indium tin oxide film containing silicon oxide was formed as a pixel electrode layer, and after that, heat treatment was performed under a nitrogen atmosphere at 250° C. for one hour.

Through the above steps, Example Transistor and Comparative Transistor were formed.

In each of Example Transistor and Comparative Transistor, the channel length (L) was 6 μm and the channel width (W) was 50 μm.

The electrical characteristics of Example Transistor and Comparative Transistor were evaluated.

Figure 11:
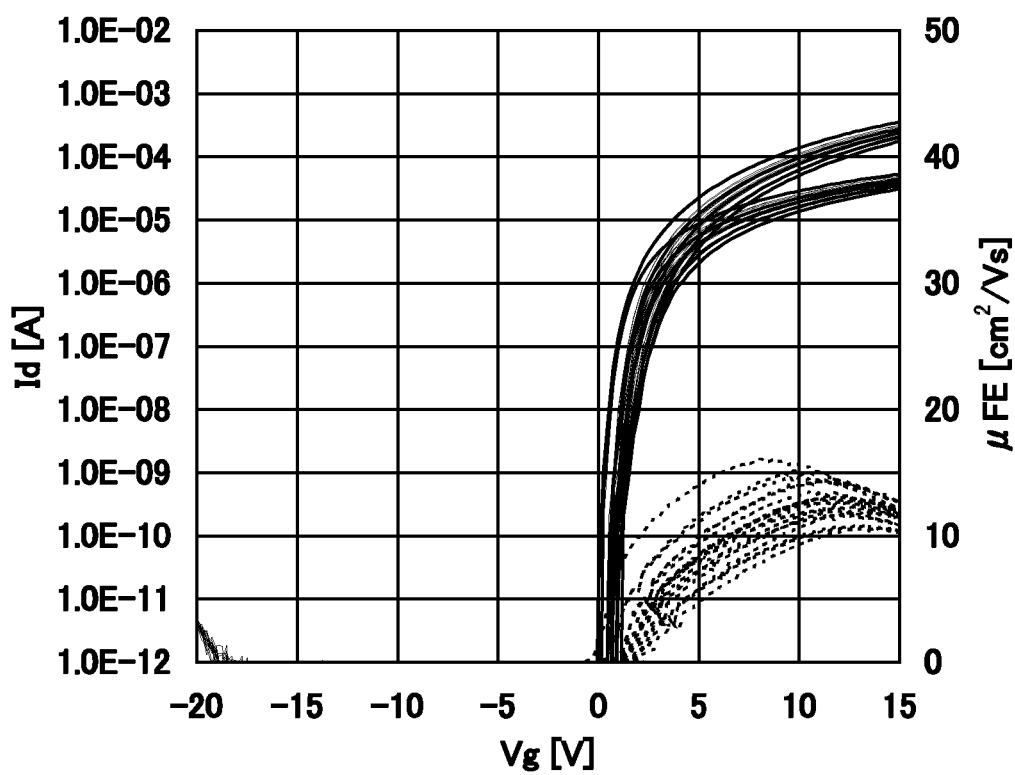
FIG. 11 shows electrical characteristics of Example Transistor.
Figure 12:
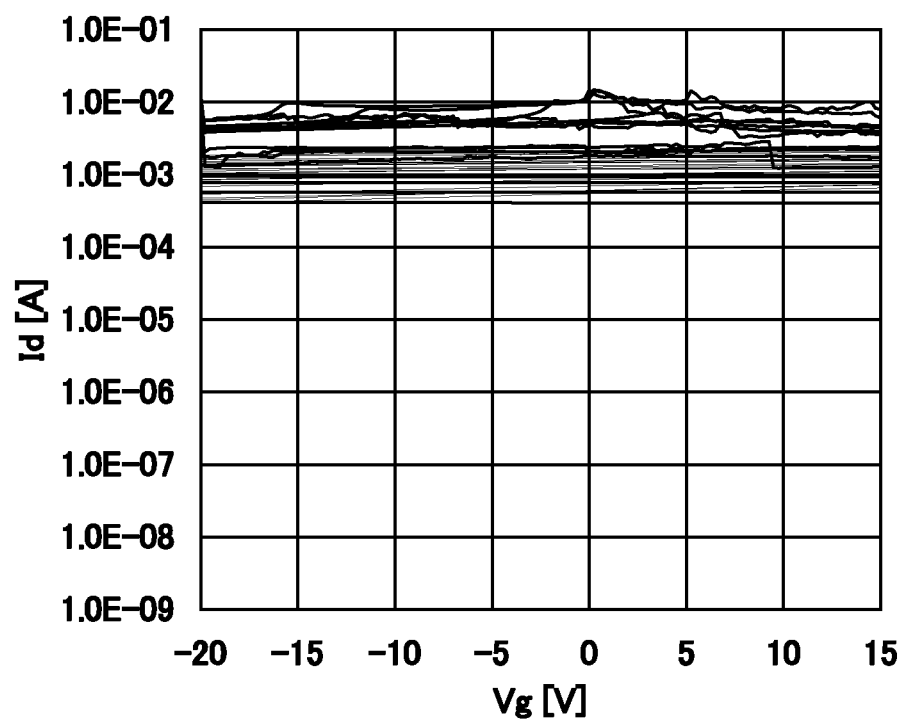
FIG. 12 shows electrical characteristics of Comparative Transistor.

FIG. 11 shows gate voltage ($V_g$)-drain current ($I_d$) characteristics and field-effect mobility of Example Transistor. FIG. 12 shows gate voltage ($V_g$)-drain current ($I_d$) characteristics of Comparative Transistor.

The measurement conditions were as follows: the drain voltage ($V_d$) was 1 V and 10 V, and the gate voltage ($V_g$) was in the range of −20 V to 15 V.

As shown in FIG. 11, Example Transistor exhibited favorable electrical characteristics as a switching element and was a normally-off transistor.

On the other hand, Comparative Transistor did not exhibit electrical characteristics as a switching element, as shown in FIG. 12.

The conditions for forming the oxide semiconductor film and the silicon oxynitride film of Example Transistor are similar to those of Example Sample in Example 1, and the conditions for forming the oxide semiconductor film and the silicon oxynitride film of Comparative Transistor are similar to those of Comparative Sample in Example 1.

Thus, it is expected that the spin density of the oxide semiconductor film of Example Transistor is lower than or equal to $1.0 \times 10^{18}$ spins/cm$^3$ and that the spin density of the oxide semiconductor film of Comparative Sample is higher than $1.0 \times 10^{18}$ spins/cm$^3$.

It is expected that the conductivity of the oxide semiconductor film of Example Transistor is lower than or equal to $1.0 \times 10^3$ S/cm$^3$ and that the conductivity of the oxide semiconductor film of Comparative Sample is higher than $1.0 \times 10^3$ S/cm$^3$.

The oxide semiconductor film of Example Transistor has a low spin density, few defects, and a low conductivity. It was therefore found that the use of such an oxide semiconductor film can provide a normally-off transistor having favorable electrical characteristics.

EXPLANATION OF REFERENCE

400: substrate, 401: gate electrode layer, 402: gate insulating film, 402a: gate insulating film, 402b: gate insulating film, 403: oxide semiconductor film, 405a: source electrode layer, 405b: drain electrode layer, 407: insulating film, 407a: insulating film, 407b: insulating film, 410: transistor, 440: transistor, 496: insulating film, 500: substrate, 502: gate insulating film, 504: interlayer insulating film, 505: color filter layer, 506: insulating film, 507: partition, 510: transistor, 511a: gate electrode layer, 511b: gate electrode layer, 512: oxide semiconductor film, 513a: conductive layer, 513b: conductive layer, 520: capacitor, 521a: conductive layer, 521b: conductive layer, 522: oxide semiconductor film, 523: conductive layer, 530: intersection of wiring layers, 533: conductive layer, 540: light-emitting element, 541: first electrode layer, 542: electroluminescent layers, 543: second electrode layer, 601: substrate, 602: photodiode, 606a: semiconductor film, 606b: semiconductor film, 606c: semiconductor film, 608: adhesive layer, 613: substrate, 622: light, 631: insulating film, 633: interlayer insulating film, 634: interlayer insulating film, 640: transistor, 641a: electrode layer, 641b: electrode layer, 642: electrode layer, 643: conductive layer, 645: conductive layer, 656: transistor, 658: photodiode reset signal line, 659: gate signal line, 671: photosensor output signal line, 672: photosensor reference signal line, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4018a: FPC, 4018b: FPC, 4019: anisotropic conductive film, 4020: insulating film, 4021: insulating film, 4030: first electrode layer, 4031: second electrode layer, 4032: insulating film, 4033: insulating film, 4035: spacer, 4510: partition, 4511: electroluminescent layer, 4513: light-emitting element, 4514: filler, 9000: table, 9001: housing, 9002: leg portion, 9003: display portion, 9004: displayed button, 9005: power cord, 9033: clasp, 9034: switch, 9035: power switch, 9036: switch, 9038: operation switch, 9100: television set, 9101: housing, 9103: display portion, 9105: stand, 9107: display portion, 9109: operation key, 9110: remote controller, 9201: main body, 9202: housing, 9203: display portion, 9204: keyboard, 9205: external connection port, 9206: pointing device, 9630: housing, 9631: display portion, 9631a: display portion, 9631b: display portion, 9632a: region, 9632b: region, 9633: solar battery, 9634: charge and discharge control circuit, 9635: battery, 9636: DC-DC converter, 9637: converter, 9638a: operation key, 9638b: operation key, 9639: keyboard display switching instruction portion.

This application is based on Japanese Patent Application serial No. 2011-278889 filed with Japan Patent Office on Dec. 20, 2011, the entire contents of which are hereby incorporated by reference.

The invention claimed is:

1. A semiconductor device comprising:
    a gate electrode layer;
    a gate insulating film over the gate electrode layer;
    an oxide semiconductor film over the gate insulating film;
    source and drain electrode layers over the oxide semiconductor film; and
    an oxide insulating film over the source and drain electrode layers, wherein the oxide insulating film is in contact with the oxide semiconductor film and contains nitrogen,
    wherein a spin density of the oxide semiconductor film is lower than or equal to $1\times10^{18}$ spins/cm$^3$.

2. The semiconductor device according to claim 1, wherein conductivity of the oxide semiconductor film is lower than or equal to $1\times10^3$ S/cm.

3. The semiconductor device according to claim 1, wherein a spin density of the oxide semiconductor film is lower than or equal to $1\times10^{17}$ spins/cm$^3$.

4. The semiconductor device according to claim 1, wherein conductivity of the oxide semiconductor film is lower than or equal to $1\times10^2$ S/cm.

5. The semiconductor device according to claim 1, wherein the oxide semiconductor film comprises a material selected from indium, gallium, zinc, and a combination thereof.

6. The semiconductor device according to claim 1, wherein at least one of the gate insulating film and the oxide insulating film comprises a silicon oxynitride film in contact with the oxide semiconductor film.

7. A semiconductor device comprising:
    an oxide semiconductor film,
    wherein a spin density of the oxide semiconductor film is lower than or equal to $1\times10^{18}$ spins/cm$^3$.

8. The semiconductor device according to claim 7, wherein conductivity of the oxide semiconductor film is lower than or equal to $1\times10^3$ S/cm.

9. The semiconductor device according to claim 7, wherein a spin density of the oxide semiconductor film is lower than or equal to $1\times10^{17}$ spins/cm$^3$.

10. The semiconductor device according to claim 7, wherein conductivity of the oxide semiconductor film is lower than or equal to $1\times10^2$ S/cm.

11. The semiconductor device according to claim 7, wherein the oxide semiconductor film comprises a material selected from indium, gallium, zinc, and a combination thereof.

* * * * *